United States Patent
Otani

(10) Patent No.: US 9,853,217 B2
(45) Date of Patent: Dec. 26, 2017

(54) CHARGE-TRANSPORTING VARNISH

(71) Applicant: NISSAN CHEMICAL INDUSTRIES, LTD., Tokyo (JP)

(72) Inventor: Naoki Otani, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 134 days.

(21) Appl. No.: 15/026,543

(22) PCT Filed: Sep. 26, 2014

(86) PCT No.: PCT/JP2014/075641
§ 371 (c)(1),
(2) Date: Mar. 31, 2016

(87) PCT Pub. No.: WO2015/050057
PCT Pub. Date: Apr. 9, 2015

(65) Prior Publication Data
US 2016/0248017 A1    Aug. 25, 2016

(30) Foreign Application Priority Data

Oct. 1, 2013 (JP) ................. 2013-206727

(51) Int. Cl.
| | | |
|---|---|---|
| H01L 51/50 | (2006.01) | |
| H01L 51/56 | (2006.01) | |
| C08G 16/02 | (2006.01) | |
| C09D 161/26 | (2006.01) | |
| H01L 51/00 | (2006.01) | |
| C09K 11/06 | (2006.01) | |
| C08G 12/26 | (2006.01) | |
| C09D 179/02 | (2006.01) | |
| C08G 73/02 | (2006.01) | |
| C09D 5/24 | (2006.01) | |
| H01L 51/52 | (2006.01) | |

(52) U.S. Cl.
CPC .......... *H01L 51/0035* (2013.01); *C08G 12/26* (2013.01); *C08G 73/026* (2013.01); *C09D 5/24* (2013.01); *C09D 161/26* (2013.01); *C09D 179/02* (2013.01); *C09K 11/06* (2013.01); *C09K 2211/1029* (2013.01); *H01L 51/001* (2013.01); *H01L 51/506* (2013.01); *H01L 51/5024* (2013.01); *H01L 51/5088* (2013.01); *H01L 51/5206* (2013.01); *H01L 51/5221* (2013.01)

(58) Field of Classification Search
CPC .................................................. C08G 16/0268
See application file for complete search history.

(56) References Cited

U.S. PATENT DOCUMENTS 4,624,999 A * 11/1986 Jenekhe ............. C08G 16/0268
                                                                       252/500
2012/0268840 A1* 10/2012 Hida ..................... B01F 17/005
                                                                       359/885

FOREIGN PATENT DOCUMENTS

| JP | 10-302963 A | | 11/1998 |
|---|---|---|---|
| JP | 2002-241455 A | | 8/2002 |
| JP | 2009043896 A | * | 2/2009 |
| WO | WO 2010/058777 A1 | | 5/2010 |
| WO | WO 2011/065395 A1 | | 6/2011 |
| WO | WO 2014/115865 A1 | | 7/2014 |
| WO | WO 2014/132834 A1 | | 9/2014 |
| WO | WO 2014/132917 A1 | | 9/2014 |

OTHER PUBLICATIONS

Adachi et al., "Electroluminescence in Organic Films with Three-Layer Structure," Japanese Journal of Applied Physics (Feb. 1988), vol. 27, No. 2, pp. L269-L271.

* cited by examiner

*Primary Examiner* — Vu A Nguyen
(74) *Attorney, Agent, or Firm* — Birch, Stewart, Kolasch & Birch, LLP

(57) ABSTRACT

A charge-transporting varnish which contains a charge-transporting substance containing fluorine atoms, a charge-transporting substance containing no fluorine atoms, a dopant substance composed of a heteropolyacid, and an organic solvent. The charge-transporting substance containing fluorine atoms is a polymer which is obtained by condensing a triaryl amine compound, an arylaldehyde compound containing fluorine atoms, a fluorene derivative having a carbonyl group and a carbazole derivative having an alkyl group or an alkyl group containing an ether structure in the N-position, and which has a weight average molecular weight of 1,000-200,000. The charge-transporting substance containing no fluorine atoms is an oligoaniline compound. A thin film formed from this charge-transporting varnish is capable of providing an organic EL element having excellent luminance characteristics and durability even in cases where the thin film is used as a single layer between a positive electrode and a light emitting layer in such a manner that the thin film is in contact with the positive electrode and the light emitting layer.

15 Claims, No Drawings

CHARGE-TRANSPORTING VARNISH

TECHNICAL FIELD

The present invention relates to a charge-transporting varnish.

BACKGROUND ART

Any organic electroluminescence element (abbreviated as organic EL element hereinafter) has a charge-transporting thin film formed therein.

There are several methods of forming the charge-transporting thin film. They fall under two large categories: dry process typified by vapor deposition; and wet process typified by spin coating. The selection of an adequate method depends on the area of thin film to be formed and the solubility in organic solvents of the substance to be made into thin film.

Any organic EL element is usually provided with an anode and an emitting layer in such a way that they hold between them one layer called hole injection layer which is adjacent to the anode and one layer called hole transport layer, one over another. Such two layers allow effective charge transport, thereby causing the organic EL element to exhibit high luminance characteristics. (See Non-Patent Document 1, for example.)

On the other hand, however, these two layers usually need additional steps to be formed individually in the production process of the organic EL element.

The recent trend in the field of electronic devices is toward the simplified manufacturing process and element structure which are essential for efficient production in high yields.

One way to achieve this object is to make the functional multi-layer film which is formed in the element by lamination into a single-layer film. In this way, it is possible not only to simplify the manufacturing process but also to directly simplify the element structure. For this reason, there has arisen in various fields of electronic device a need for new materials that yield a functional single-layer film which will replace the conventional functional multi-layer film.

In the field of organic EL element, too, there is an increasing demand for new materials for a single-layer film which replaces the functional multi-layer film including of a hole injection layer and a hole transport layer, employed in the ordinary element structure.

PRIOR ART DOCUMENT

Non-Patent Document

Non-Patent Document 1: Adachi C. et al., Jpn. J. Appl. Phys., 1988, 27(2), pp. L269-271

SUMMARY OF THE INVENTION

Problems to be Solved by the Invention

The present invention was completed in view of the above circumstances. It is an object of the present invention to provide a charge-transporting varnish which gives rise to a thin film which helps realize an organic EL element having outstanding luminance characteristics and durability even in the case where the thin film is used as a single layer formed between and in contact with the anode and the emitting layer.

Means for Solving the Problems

As the result of extensive studies to achieve the above object, the present inventors found that it is possible to produce an organic EL element having outstanding luminance characteristics and durability by using a thin film formed from a charge-transporting varnish which includes a predetermined charge-transporting substance containing a fluorine atom, a predetermined charge-transporting substance containing no fluorine atom, and a dopant substance of heteropolyacid, even in the case where the thin film is used as a single layer formed between and in contact with the anode and the emitting layer. This finding led to the present invention.

Thus, the present invention covers the following.

1. A charge-transporting varnish including:

a charge-transporting substance containing a fluorine atom;

a charge-transporting substance containing no fluorine atom;

a dopant substance of heteropolyacid; and an organic solvent, wherein the charge-transporting substance containing the fluorine atom is a polymer having a weight-average molecular weight of 1,000 to 200,000 which is obtained by condensation from a triarylamine compound, arylaldehyde compound containing a fluorine atom, fluorene derivative having a carbonyl group, and carbazole derivative having at the N-position an alkyl group or an alkyl group having the ether structure, the charge-transporting substance containing no fluorine atom is an oligoaniline compound.

2. The charge-transporting varnish of 1, wherein the charge-transporting substance containing the fluorine atom is a polymer which is obtained by condensation from a triarylamine compound represented by Formula (1), an arylaldehyde compound containing a fluorine atom represented by Formula (2), a fluorene derivative having a carbonyl group represented by Formula (3) or (4), and a carbazole derivative represented by Formula (5):

[Chemical Formula 1]

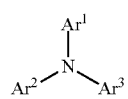

(1)

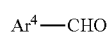

(2)

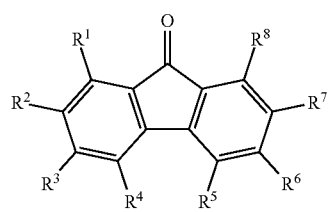

(3)

-continued

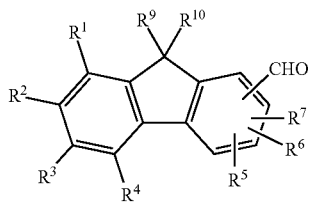
(4)

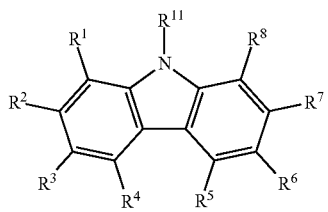
(5)

wherein $Ar^1$ to $Ar^3$ mutually independently represent an aryl group having 6 to 20 carbon atoms with an optional substituent $Z^1$, with each aryl group being composed of carbon atoms at least one of which has no substituent;

$Ar^4$ represents an aryl group having 6 to 20 carbon atoms with at least one substituent $Z^3$ and an optional substituent $Z^4$;

$R^1$ to $R^8$ mutually independently represent a hydrogen atom, halogen atom, nitro group, cyano group or an alkyl group having 1 to 20 carbon atoms, alkenyl group having 2 to 20 carbon atoms, or alkynyl group having 2 to 20 carbon atoms, each having an optional substituent $Z^2$;

$R^9$ and $R^{10}$ mutually independently represent a hydrogen atom or an alkyl group having 1 to 20 carbon atoms, (poly)ethyleneoxide group having 2 to 20 carbon atoms, alkenyl group having 2 to 20 carbon atoms, or alkynyl group having 2 to 20 carbon atoms, each having an optional substituent $Z^2$ or alkyl group having 1 to 20 carbon atoms, a substituent of ethenyl group or ethynyl group and an optional substituent $Z^2$;

$R^{11}$ represents an alkyl group having 1 to 20 carbon atoms or alkyl group having 2 to 20 carbon atoms and having the ether structure, both having an optional substituent $Z^2$;

$Z^1$ represents a halogen atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^2$;

$Z^2$ represents a halogen atom, nitro group, or cyano group;

$Z^3$ represents a fluorine atom, fluorinated alkyl group having 1 to 20 carbon atoms, or fluorinated aryl group having 6 to 20 carbon atoms;

$Z^4$ represents a chlorine atom, bromine atom, iodine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^5$; and $Z^5$ represents a chlorine atom, bromine atom, iodine atom, nitro group, or cyano group.

3. The charge-transporting varnish of 2,
wherein the triarylamine compound is a triphenylamine derivative represented by Formula (6):

[Chemical Formula 2]

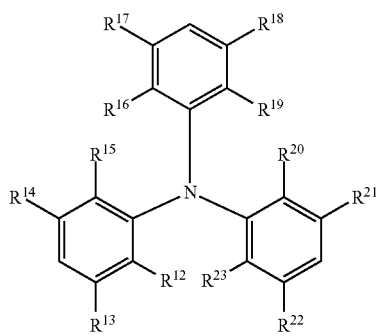
(6)

wherein $R^{12}$ to $R^{23}$ mutually independently represent a hydrogen atom, halogen atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^2$, and $Z^2$ is defined as above.

4. The charge-transporting varnish of 2 or 3,
wherein the arylaldehyde compound is a benzaldehyde derivative represented by Formula (7) or (8):

[Chemical Formula 3]

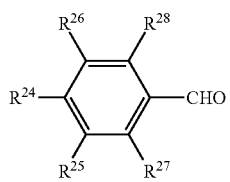
(7)

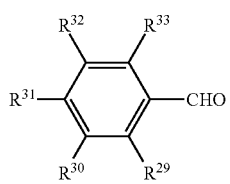
(8)

wherein $R^{24}$ represents a fluorine atom or fluorinated alkyl group having 1 to 20 carbon atoms;

$R^{25}$ to $R^{28}$ mutually independently represent a hydrogen atom, nitro group, cyano group, or an alkyl group having 1 to 20 carbon atoms optionally substituted with a nitro group or cyano group; and $R^{29}$ to $R^{33}$ mutually independently represent a fluorine atom or fluorinated alkyl group having 1 to 20 carbon atoms.

5. The charge-transporting varnish of any one of 1 to 4,
wherein the oligoaniline compound is one represented by Formula (9):

[Chemical Formula 4]

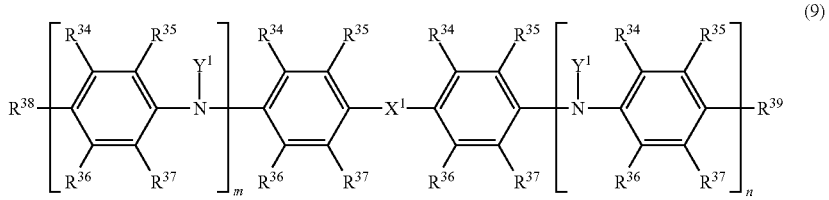

(9)

wherein $R^{34}$ to $R^{39}$ mutually independently represent a hydrogen atom, halogen atom other than fluorine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^6$, or an aryl group having 6 to 20 carbon atoms or heteroaryl group having 2 to 20 carbon atoms, each having an optional substituent $Z^7$, or —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$, or —$C(O)NY^{12}Y^{13}$ group;

$Y^2$ to $Y^{13}$ mutually independently represent an alkyl group having 1 to 20 carbon atoms, alkenyl group having 2 to 20 carbon atoms, or alkynyl group having 2 to 20 carbon atoms, each having an optional substituent $Z^6$, or an aryl group having 6 to 20 carbon atoms or heteroaryl group having 2 to 20 carbon atoms, each having an optional substituent $Z^7$;

$X^1$ represents —$NY^1$—, —O—, —S—, —$(CR^{40}R^{41})_k$—, or a single bond wherein $R^{40}$ and $R^{41}$ are identical with the $R^{34}$ mentioned above; letter k represents an integer of 1 to 20; $Y^1$ represents independently a hydrogen atom, or an alkyl group having 1 to 20 carbon atoms, alkenyl group having 2 to 20 carbon atoms, or alkynyl group having 2 to 20 carbon atoms, each having an optional substituent $Z^6$, or an aryl group having 6 to 20 carbon atoms or heteroaryl group having 2 to 20 carbon atoms, each having an optional substituent $Z^7$;

$Z^6$ represents a halogen atom other than fluorine atom, nitro group, or cyano group, or an aryl group having 6 to 20 carbon atoms or heteroaryl group having 2 to 20 carbon atoms, each having an optional substituent $Z^8$;

$Z^7$ represents a halogen atom other than fluorine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^8$;

$Z^8$ represents a halogen atom other than fluorine atom, nitro group, or cyano group; and letters m and n mutually independently represent an integer of 1 to 10, with m+n≤10.

6. The charge-transporting varnish of any one of 1 to 5, wherein the heteropolyacid is phosphotungstic acid.

7. The charge-transporting varnish of any one of 1 to 6, further including a curing agent.

8. The charge-transporting varnish of 7, wherein the curing agent is a curing agent of acrylate type.

9. A charge-transporting thin film prepared from the charge-transporting varnish of any one of 1 to 8.

10. An electronic device having the charge-transporting thin film of 9.

11. An organic electroluminescence element having the charge-transporting thin film of 9.

12. An organic electroluminescence element including at least an anode, a cathode, an emitting layer, and a charge-transporting thin film of 9, wherein the charge-transporting thin film is arranged between and in contact with the anode and the emitting layer.

13. A method for preparing a charge-transporting thin film including:

coating a substrate with the charge-transporting varnish of any one of 1 to 8; and evaporating a solvent.

14. A method for preparing an organic electroluminescence element which has the charge-transporting thin film of 9.

15. A polymer having a weight-average molecular weight of 1,000 to 200,000 which is obtained by condensation from a triarylamine compound represented by Formula (1), a fluorine atom-containing arylaldehyde compound represented by Formula (2), a fluorene derivative having a carbonyl group represented by Formula (3) or (4), and a carbazole derivative represented by Formula (5):

[Chemical Formula 5]

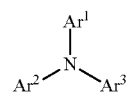

(1)

(2)

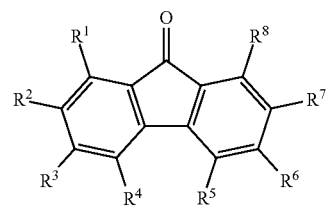

(3)

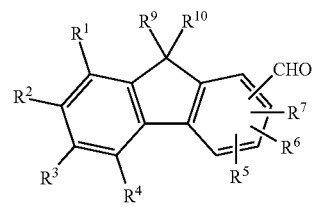

(4)

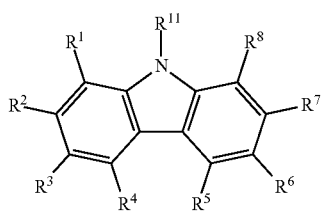
(5)

wherein Ar¹ to Ar³ mutually independently represent an aryl group having 6 to 20 carbon atoms with an optional substituent $Z^1$, each aryl group being composed of carbon atoms at least one of which has no substituent;
Ar⁴ represents an aryl group having 6 to 20 carbon atoms with at least one substituent $Z^3$ and an optional substituent $Z^4$;
R¹ to R⁸ mutually independently represent a hydrogen atom, halogen atom, nitro group or cyano group or an alkyl group having 1 to 20 carbon atoms, alkenyl group having 2 to 20 carbon atoms, or alkynyl group having 2 to 20 carbon atoms, each having an optional substituent $Z^2$;
R⁹ and R¹⁰ mutually independently represent a hydrogen atom and an alkyl group having 1 to 20 carbon atoms, (poly)ethyleneoxide group having 2 to 20 carbon atoms, alkenyl group having 2 to 20 carbon atoms, or alkynyl group having 2 to 20 carbon atoms, each having an optional substituent $Z^2$ or alkyl group having 1 to 20 carbon atoms, a substituent of ethenyl group or ethynyl group and an optional substituent $Z^2$;
R¹¹ represents an alkyl group having 1 to 20 carbon atoms or alkyl group having 2 to 20 carbon atoms and the ether structure, both having an optional substituent $Z^2$;
$Z^1$ represents a halogen atom, nitro group, cyano group, or an alkyl group having 1 to 20 carbon atoms, alkenyl group having 2 to 20 carbon atoms, or alkynyl group having 2 to 20 carbon atoms, each having an optional substituent $Z^2$;
$Z^2$ represents a halogen atom, nitro group, or cyano group;
$Z^3$ represents a fluorine atom, fluorinated alkyl group having 1 to 20 carbon atoms, or fluorinated aryl group having 6 to 20 carbon atoms;
$Z^4$ represents a chlorine atom, bromine atom, iodine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^5$; and
$Z^5$ represents a chlorine atom, bromine atom, iodine atom, nitro group, or cyano group.

Advantageous Effects of the Invention

The charge-transporting varnish of the present invention gives rise to an organic EL element excelling in luminance characteristics and durability even in the case where it is formed as a single layer arranged between and in contact with the anode and the emitting layer. This may be reasoned as follows. The charge-transporting substance containing the fluorine atom easily migrates to the surface of the thin film, which is adjacent to the emitting layer, thereby causing the charge-transporting substance containing the fluorine atom to localize near the front side of the thin film which is adjacent to the emitting layer, and also causing the charge-transporting substance containing no fluorine atom to localize near the back side of the thin film which is adjacent to the anode. Such localization separates the hole injecting region and the hole transporting region from each other in the single layer, with the result that the hole injecting component decreases and the hole transporting component increases in going from the anode to the emitting layer. Consequently, the single layer functions as the hole injecting-transporting layer as if there exist two layers.

The charge-transporting varnish according to the present invention will improve the element such that the functional multilayered film therein is replaced by a single layer. This simplifies the manufacturing process and contributes to high yields, cost reduction, weight saving, and miniaturization.

Moreover, the charge-transporting varnish according to the present invention can be applied by various wet processes, such as spin coating and slit coating, which are suitable for coating over a large area. Such wet processes permit the uniform production of the thin film excelling in charge-transportability. Thus, the present invention will keep pace with the recent advancement in the field of organic EL elements.

In addition, the thin film obtained from the charge-transporting varnish according to the present invention can be used also as an antistatic film.

EMBODIMENT FOR CARRYING OUT THE INVENTION

The following is a detailed description of the present invention.

The charge-transporting varnish according to the present invention includes a charge-transporting substance containing a fluorine atom, a charge-transporting substance containing no fluorine atom, a dopant substance of heteropolyacid, and an organic solvent, wherein the charge-transporting substance containing the fluorine atom is a polymer having a weight-average molecular weight of 1,000 to 200,000 which is obtained by condensation from a triarylamine compound, arylaldehyde compound containing a fluorine atom, fluorene derivative having a carbonyl group, and carbazole derivative having at the N-position an alkyl group or an alkyl group having the ether structure, the charge-transporting substance containing no fluorine atom is an oligoaniline compound.

In the present invention, the term "charge-transporting" is synonymous with "electrically conductive" and also with "hole-transporting." The charge-transporting substance may be any substance capable of transporting charges by itself or any substance that transports charges when used in combination with a dopant substance. The charge-transporting varnish means one which is capable of transporting charges by itself or one which gives rise to a solid film capable of transporting charges.

In the present invention, no specific restrictions are imposed on the triarylamine compound used to prepare the charge-transporting substance containing the fluorine atom. However, it should preferably be one of those compounds represented by Formula (1) below.

[Chemical Formula 6]

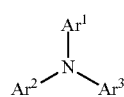
(1)

In Formula (1), Ar¹ to Ar³ mutually independently represent an aryl group having 6 to 20 carbon atoms with an optional substituent $Z^1$, each aryl group being composed of carbon atoms at least one of which has no substituent (or has a hydrogen atom). This is because the aryl group needs a site for condensation reaction with an aldehyde compound or a fluorene derivative.

Typical examples of the aryl group having 6 to 20 carbon atoms includes phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, and 9-phenanthryl group. Preferable among them is a phenyl group which has an optional substituent $Z^1$.

The substituent $Z^1$ represents a halogen atom, nitro group, or cyano group, or alkyl group having 1 to 20 carbon atoms, alkenyl group having 2 to 20 carbon atoms, or alkynyl group having 2 to 20 carbon atoms which has an optional substituent $Z^2$. The substituent $Z^2$ represents a halogen atom, nitro group, or cyano group.

Examples of the halogen atoms include fluorine atom, chlorine atom, bromine atom, and iodine atom.

The alkyl group having 1 to 20 carbon atoms includes linear, branched, and cyclic ones. Examples of the linear and branched alkyl groups having 1 to 20 carbon atoms include methyl group, ethyl group, n-propyl group, isopropyl group, n-butyl group, isobutyl group, s-butyl group, t-butyl group, n-pentyl group, n-hexyl group, 2-ethylhexyl group, n-heptyl group, n-octyl group, n-nonyl group, and n-decyl group. Examples of the cyclic alkyl groups having 3 to 20 carbon atoms include cyclopropyl group, cyclobutyl group, cyclopentyl group, cyclohexyl group, cycloheptyl group, cyclooctyl group, cyclononyl group, cyclodecyl group, bicyclobutyl group, bicyclopentyl group, bicyclohexyl group, bicycloheptyl group, bicyclooctyl group, bicyclononyl group, and bicyclodecyl group.

Typical examples of the alkenyl group having 2 to 20 carbon atoms include ethenyl group, n-1-propenyl group, n-2-propenyl group, 1-methylethenyl group, n-1-butenyl group, n-2-butenyl group, n-3-butenyl group, 2-methyl-1-propenyl group, 2-methyl-2-propenyl group, 1-ethylethenyl group, 1-methyl-1-propenyl group, 1-methyl-2-propenyl group, n-1-pentenyl group, n-1-decenyl group, and n-1-eicosenyl group.

Typical examples of the alkynyl group having 2 to 20 carbon atoms include ethynyl group, n-1-propynyl group, n-2-propynyl group, n-1-butynyl group, n-2-butynyl group, n-3-butynyl group, 1-methyl-2-propynyl group, n-1-pentynyl group, n-2-pentynyl group, n-3-pentynyl group, n-4-pentynyl group, 1-methyl-n-butynyl group, 2-methyl-n-butynyl group, 3-methyl-n-butynyl group, 1,1-dimethyl-n-propynyl group, n-1-hexynyl group, n-1-decynyl group, n-1-pentadecynyl group, and n-1-eicosynyl group.

Preferable examples of the substituent $Z^1$ include halogen atom, nitro group, cyano group, and alkyl group having 1 to 20 carbon atoms which may have an optional substituent $Z^2$. More preferable examples include halogen atom and alkyl group having 1 to 4 carbon atoms which may have an optional substituent $Z^2$. The substituent $Z^1$ should preferably be absent (or there should be no substitution).

The substituent $Z^2$ should preferably be a halogen atom, especially a fluorine atom. The substituent $Z^2$ should preferably be absent (or there should be no substitution).

Typical examples of the triarylamine compound unrestrictedly include triphenylamine derivatives represented by Formula (6).

[Chemical Formula 7]

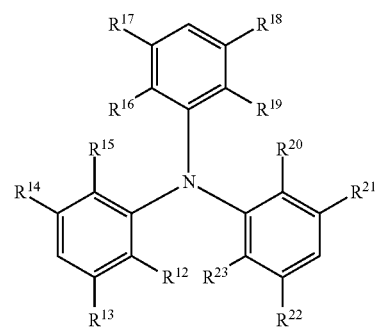

(6)

In Formula (6), $R^{12}$ to $R^{23}$ mutually independently represent a hydrogen atom, halogen atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^2$, and the halogen atom, alkyl group, alkenyl group, alkynyl group and $Z^2$ are defined as above.

Preferable examples of $R^{12}$ to $R^{23}$ include hydrogen atom, halogen atom, nitro group, cyano group, and alkyl group having 1 to 20 carbon atoms which may have an optional substituent $Z^2$. More preferable examples include hydrogen atom, fluorine atom, and alkyl group having 1 to 4 carbon atoms which may have an optional substituent $Z^2$. In the most desirable case, all of $R^{12}$ to $R^{23}$ represent hydrogen atoms.

The arylaldehyde compound containing the fluorine atom should preferably be the one represented by Formula (2), although not specifically restricted.

[Chemical Formula 8]

$$Ar^4\text{—CHO} \qquad (2)$$

In Formula (2), $Ar^4$ represents an aryl group having 6 to 20 carbon atoms with at least one substituent $Z^3$ and an optional substituent $Z^4$. The aryl group is defined as above.

The substituent $Z^3$ represents a fluorine atom, fluorinated alkyl group having 1 to 20 carbon atoms, or fluorinated aryl group having 6 to 20 carbon atoms; $Z^4$ represents a chlorine atom, bromine atom, iodine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^5$; and $Z^5$ represents a chlorine atom, bromine atom, iodine atom, nitro group, or cyano group.

Examples of the fluorinated alkyl group having 1 to 20 carbon atoms and fluorinated aryl group having 6 to 20 carbon atoms include those alkyl groups having 1 to 20 carbon atoms and aryl groups having 6 to 20 carbon atoms mentioned above in which the hydrogen atoms on the carbon atoms are substituted with at least one fluorine atom.

In addition, the alkyl group, alkenyl group, and alkynyl group include the same examples as mentioned above.

Preferable examples of $Z^3$ include fluorine atom and fluorinated alkyl group having 1 to 10 carbon atoms, more preferable examples include fluorine atom and fluorinated alkyl group having 1 to 4 carbon atoms, and most desirable examples include fluorine atom and perfluoroalkyl group having 1 to 4 carbon atoms.

Also, a preferable example of $Z^4$ is an alkyl group having 1 to 20 carbon atoms which has an optional substituent $Z^5$, more preferable example is an alkyl group having 1 to 10 carbon atoms which has an optional substituent $Z^5$, and further preferable example is an alkyl group having 1 to 4 carbon atoms which has an optional substituent $Z^5$. Most desirably, the substituent $Z^4$ should be absent (or there should be no substitution).

Moreover, preferable examples of $Z^5$ include chlorine atom and bromine atom. More preferably, the substituent $Z^5$ should be absent (or there should be no substitution).

Typical examples of the fluorinated alkyl group include trifluoromethyl group, pentafluoroethyl group, 2,2,2-trifluoroethyl group, heptafluoropropyl group, 2,2,3,3,3-pentafluoropropyl group, 2,2,3,3-tetrafluoropropyl group, 2,2,2-trifluoro-1-(trifluoromethyl)ethyl group, nonafluorobutyl group, 4,4,4-trifluorobutyl group, undecafluoropentyl group, 2,2,3,3,4,4,5,5,5-nonafluoropentyl group, 2,2,3,3,4,4,5,5-octafluoropentyl group, tridecafluorohexyl group, 2,2,3,3,4,4,5,5,6,6,6-undecafluorohexyl group, 2,2,3,3,4,4,5,5,6,6-decafluorohexyl group, and 3,3,4,4,5,5,6,6,6-nonafluorohexyl group.

Typical examples of the fluorinated aryl group include 4-fluorophenyl group, 2,3-difluorophenyl group, 2,4-difluorophenyl group, 2,5-difluorophenyl group, 2,6-difluorophenyl group, pentafluorophenyl group, 1-fluoro-2-naphthyl group, 1-fluoro-3-naphthyl group, 1-fluoro-4-naphthyl group, 1-fluoro-5-naphthyl group, 1-fluoro-6-naphthyl group, 1-fluoro-7-naphthyl group, 1-fluoro-8-naphthyl group, 2-fluoro-1-naphthyl group, 2-fluoro-3-naphthyl group, 2-fluoro-4-naphthyl group, 2-fluoro-5-naphthyl group, 2-fluoro-6-naphthyl group, 2-fluoro-7-naphthyl group, 2-fluoro-8-naphthyl group, and perfluoronaphthyl group.

Typical examples of the arylaldehyde compound unrestrictedly include those benzaldehyde derivatives represented by Formula (7) or (8).

[Chemical Formula 9]

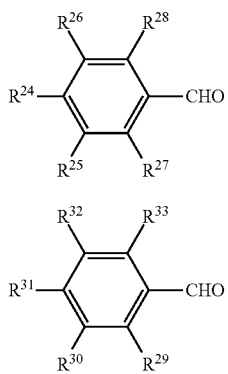

(7)

(8)

In Formula (7), $R^{24}$ represents a fluorine atom or a fluorinated alkyl group having 1 to 20 carbon atoms; $R^{25}$ to $R^{28}$ mutually independently represent a hydrogen atom, nitro group, cyano group, or an alkyl group having 1 to 20 carbon atoms optionally substituted with a nitro group or cyano group. These fluorinated alkyl groups and alkyl groups are identical with those mentioned above.

Preferable examples of $R^{24}$ include fluorine atom and fluorinated alkyl group having 1 to 10 carbon atoms, more preferable examples include fluorine atom and fluorinated alkyl group having 1 to 4 carbon atoms, and most desirable examples include fluorine atom and perfluoroalkyl group having 1 to 4 carbon atoms, especially fluorine atom and trifluoromethyl group.

Preferable examples of $R^{25}$ to $R^{28}$ include hydrogen atom and unsubstituted alkyl group having 1 to 20 carbon atoms, more preferable examples include hydrogen atom and unsubstituted alkyl group having 1 to 10 carbon atoms, and most desirable examples include hydrogen atom and unsubstituted alkyl group having 1 to 4 carbon atoms, especially hydrogen atom and methyl group. Those compounds in which all of $R^{25}$ to $R^{28}$ are hydrogen atoms are most suitable.

In Formula (8), $R^{29}$ to $R^{33}$ mutually independently represent a fluorine atom or fluorinated alkyl group having 1 to 20 carbon atoms. The fluorinated alkyl group is identical with the one mentioned above.

Preferable examples of $R^{29}$ to $R^{33}$ include fluorine atom and fluorinated alkyl group having 1 to 10 carbon atoms, more preferable examples include fluorine atom and fluorinated alkyl group having 1 to 4 carbon atoms, and most desirable examples include fluorine atom and perfluoroalkyl group having 1 to 4 carbon atoms, especially fluorine atom and trifluoromethyl group. Those compounds in which all of $R^{29}$ to $R^{33}$ are fluorine atoms are most suitable.

Moreover, preferable examples of the fluorene derivative having a carbonyl group include unrestrictedly the fluorene derivative represented by Formula (3) or (4).

[Chemical Formula 10]

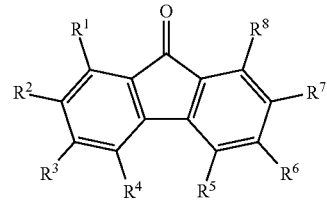

(3)

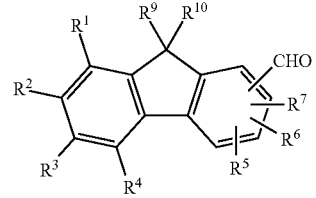

(4)

In Formula (3), $R^1$ to $R^8$ mutually independently represent a hydrogen atom, halogen atom, nitro group, or cyano group or an alkyl group having 1 to 20 carbon atoms, alkenyl group having 2 to 20 carbon atoms, or alkynyl group having 2 to 20 carbon atoms, each having an optional substituent $Z^2$. The halogen atom, alkyl group, alkenyl group, alkynyl group, and $Z^2$ are defined as above.

Preferable examples of $R^1$ to $R^8$ include hydrogen atom, fluorine atom, and alkyl group having 1 to 10 carbon atoms with an optional substituent $Z^2$; and more preferable examples include hydrogen atom, fluorine atom, and alkyl group having 1 to 4 carbon atoms with an optional substituent $Z^2$. Those compounds in which all of $R^1$ to $R^8$ are hydrogen atoms are most desirable.

Also, a preferable example of the substituent $Z^2$ is a halogen atom, especially a fluorine atom. Most desirably, the substituent $Z^2$ should be absent (or there should be no substitution).

In Formula (4), $R^1$ to $R^7$ mutually independently represent a hydrogen atom, halogen atom, nitro group, or cyano group or an alkyl group having 1 to 20 carbon atoms, alkenyl group having 2 to 20 carbon atoms, or alkynyl group having 2 to 20 carbon atoms, each optionally substituted with $Z^2$. $R^9$ and $R^{10}$ mutually independently represent a hydrogen atom or an alkyl group having 1 to 20 carbon atoms, (poly)ethyleneoxide group having 2 to 20 carbon atoms, alkenyl group having 2 to 20 carbon atoms, alkynyl group having 2 to 20 carbon atoms, each having an optional substituent $Z^2$, or an alkyl group having 1 to 20 carbon atoms, a substituent of ethenyl group or ethynyl group, and an optional substituent $Z^2$. Here, the halogen atom, alkyl group, alkenyl group, alkynyl group, and $Z^2$ are defined as above.

Preferable examples of $R^1$ to $R^7$ include hydrogen atom, fluorine atom, and alkyl group having 1 to 10 carbon atoms optionally substituted with $Z^2$; and more preferable examples include hydrogen atom, fluorine atom, and alkyl group having 1 to 4 carbon atoms optionally substituted with $Z^2$. Those compounds in which all of $R^1$ to $R^7$ are hydrogen atoms are most desirable.

Also, preferable examples of $R^9$ and $R^{10}$ include hydrogen atom, alkyl group having 1 to 10 carbon atoms and (poly)ethyleneoxide group having 2 to 10 carbon atoms, each having an optional substituent $Z^2$; and more preferable examples include hydrogen atom and alkyl group having 1 to 10 carbon atoms with an optional substituent $Z^2$. Those compounds in which both $R^9$ and $R^{10}$ are hydrogen atoms are most desirable.

The substituent $Z^2$ should preferably be a halogen atom, more preferably a fluorine atom. Most desirably, the substituent $Z^2$ should be absent (or there should be no substitution).

The carbazole derivative, which has at the N position an alkyl group or an alkyl group having the ether structure, unrestrictedly includes the one represented by Formula (5).

[Chemical Formula 11]

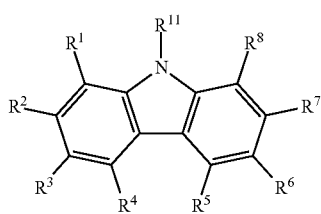

(5)

In Formula (5), $R^1$ to $R^8$ mutually independently represent a hydrogen atom, halogen atom, nitro group or cyano group or an alkyl group having 1 to 20 carbon atoms, alkenyl group having 2 to 20 carbon atoms, or alkynyl group having 2 to 20 carbon atoms, each optionally substituted with $Z^2$. $R^{11}$ represents an alkyl group having 1 to 20 carbon atoms or alkyl group having 2 to 20 carbon atoms and having the ether structure, both having an optional substituent $Z^2$. Here, the halogen atom, alkyl group, alkenyl group, alkynyl group, and $Z^2$ are defined as above.

The following represents the typical examples of the alkyl group having 2 to 20 carbon atoms and having the ether structure.
$CH_2OCH_3$, $CH_2OCH_2CH_3$, $CH_2O(CH_2)_2CH_3$, $CH_2OCH(CH_3)_2$, $CH_2O(CH_2)_3CH_3$, $CH_2OCH_2CH(CH_3)_2$, $CH_2OC(CH_3)_3$, $CH_2O(CH_2)_4CH_3$, $CH_2OCH(CH_3)(CH_2)_2CH_3$, $CH_2O(CH_2)_2CH(CH_3)_2$, $CH_2OCH(CH_3)(CH_2)_3CH_3$, $CH_2O(CH_2)_5CH_3$, $CH_2OCH_2CH(CH_3)(CH_2)_2CH_3$, $CH_2O(CH_2)_2CH(CH_3)CH_2CH_3$, $CH_2O(CH_2)_3CH(CH_3)_2$, $CH_2OC(CH_3)_2(CH_2)_2CH_3$, $CH_2OCH(CH_2CH_3)(CH_2)_2CH_3$, $CH_2OC(CH_3)_2CH(CH_3)_2$, $CH_2O(CH_2)_6CH_3$, $CH_2O(CH_2)_7CH_3$, $CH_2OCH_2CH(CH_3)(CH_2)_3CH_3$, $CH_2O(CH_2)_8CH_3$, $CH_2O(CH_2)_9CH_3$, $CH_2O(CH_2)_{10}CH_3$, $CH_2O(CH_2)_{11}CH_3$, $CH_2O(CH_2)_{12}CH_3$, $CH_2O(CH_2)_{13}CH_3$, $CH_2O(CH_2)_{14}CH_3$, $CH_2O(CH_2)_{15}CH_3$, $CH_2O(CH_2)_{16}CH_3$, $CH_2O(CH_2)_{17}CH_3$, $CH_2O(CH_2)_{18}CH_3$, $CH_2CH_2OCH_3$, $CH_2CH_2OCH_2CH_3$, $CH_2CH_2O(CH_2)_2CH_3$, $CH_2CH_2OCH(CH_3)_2$, $CH_2CH_2O(CH_2)_3CH_3$, $CH_2CH_2OCH_2CH(CH_3)_2$, $CH_2CH_2OC(CH_3)_3$, $CH_2CH_2O(CH_2)_4CH_3$, $CH_2CH_2OCH(CH_3)(CH_2)_2CH_3$, $CH_2CH_2OCH_2CH(CH_3)_2$, $CH_2CH_2O(CH_2)_2CH(CH_3)_2$, $CH_2CH_2OC(CH_3)_3$, $CH_2CH_2OCH(CH_3)(CH_2)_3CH_3$, $CH_2CH_2O(CH_2)_5CH_3$, $CH_2CH_2OCH(CH_3)(CH_2)_2CH_3$, $CH_2CH_2OCH_2CH(CH_3)(CH_2)_2CH_3$, $CH_2CH_2O(CH_2)_2CH(CH_3)CH_2CH_3$, $CH_2CH_2O(CH_2)_3CH(CH_3)_2$, $CH_2CH_2OC(CH_3)_2(CH_2)_2CH_3$, $CH_2CH_2OCH(CH_2CH_3)(CH_2)_2CH_3$, $CH_2CH_2OC(CH_3)_2CH(CH_3)_2$, $CH_2CH_2O(CH_2)_6CH_3$, $CH_2CH_2O(CH_2)_7CH_3$, $CH_2CH_2O(CH_2)_8CH_3$, $CH_2CH_2O(CH_2)_9CH_3$, $CH_2CH_2O(CH_2)_{10}CH_3$, $CH_2CH_2O(CH_2)_{11}CH_3$, $CH_2CH_2O(CH_2)_{12}CH_3$, $CH_2CH_2O(CH_2)_{13}CH_3$, $CH_2CH_2O(CH_2)_{14}CH_3$, $CH_2CH_2O(CH_2)_{15}CH_3$, $CH_2CH_2O(CH_2)_{16}CH_3$, $CH_2CH_2O(CH_2)_{17}CH_3$, $CH_2CH_2CH_2OCH_3$, $CH_2CH_2CH_2OCH_2CH_3$, $CH_2CH_2CH_2O(CH_2)_2CH_3$, $CH_2CH_2CH_2OCH(CH_3)_2$, $CH_2CH_2CH_2O(CH_2)_3CH_3$, $CH_2CH_2CH_2OCH_2CH(CH_3)$, $CH_2CH_2CH_2OC(CH_3)_3$, $CH_2CH_2CH_2O(CH_2)_4CH_3$, $CH_2CH_2CH_2OCH(CH_3)(CH_2)_2CH_3$, $CH_2CH_2CH_2OCH_2CH(CH_3)_2$, $CH_2CH_2CH_2O(CH_2)_2CH(CH_3)_2$, $CH_2CH_2CH_2OC(CH_3)_3$, $CH_2CH_2CH_2OCH(CH_3)(CH_2)_3CH_3$, $CH_2CH_2CH_2O(CH_2)_5CH_3$, $CH_2CH_2CH_2OCH(CH_3)(CH_2)_3CH_3$, $CH_2CH_2CH_2OCH_2CH(CH_3)(CH_2)_2CH_3$, $CH_2CH_2CH_2O(CH_2)_2CH(CH_3)CH_2CH_3$, $CH_2CH_2CH_2O(CH_2)_3CH(CH_3)_2$, $CH_2CH_2CH_2OC(CH_3)_2(CH_2)_2CH_3$, $CH_2CH_2CH_2OCH(CH_2CH_3)(CH_2)_2CH_3$, $CH_2CH_2CH_2OC(CH_3)_2CH(CH_3)_2$, $CH_2CH_2CH_2O(CH_2)_6CH_3$, $CH_2CH_2CH_2O(CH_2)_7CH_3$, $CH_2CH_2CH_2OCH_2CH(CH_3)(CH_2)_3CH_3$, $CH_2CH_2OCH_2CH_2OCH_3$, $CH_2CH_2OCH_2CH_2OCH_2OCH_3$, $CH_2CH_2OCH_2CH_2OCH_2CH_2OCH_3$, $CH_2CH_2OCH_2CH_2OCH_2CH_2OCH_2OCH_3$, $CH_2CH_2OCH_2CH_2OCH_2CH_2OCH_2CH_2OCH_3$, $CH_2CH_2OCH_2CH_2OCH_2CH_2OCH_2CH_2OCH_2CH_2OCH_3$, $CH_2CH_2OCH_2CH_2OCH_2CH_2OCH_2OCH_3$, $CH_2CH_2OCH_2CH_2OCH_2CH_2OCH_2CH_2OCH_2CH_2OCH_3$, $CH_2CH_2CH_2OCH_2CH_2OCH_3$, $CH_2CH_2CH_2OCH_2CH_2CH_2OCH_2CH_2CH_2OCH_3$, $CH_2CH_2CH_2OCH_2CH_2CH_2OCH_2CH_2CH_2OCH_2CH_2OCH_3$, $CH_2CH_2CH_2OCH_2CH_2CH_2OCH_3$, $CH_2CH_2CH_2OCH_2CH_2CH_2OCH_2CH_2OCH_3$, $CH_2CH_2CH_2OCH_2CH_2CH_2OCH_3$, $CH_2CH_2CH_2OCH_2CH_2CH_2OCH_2CH_2CH_2OCH_2CH_2CH_2OCH_3$, $CH_2CH_2OCH_2CH_2OCH_2CH_2OCH_2CH_3$, $CH_2CH_2OCH_2CH_2OCH_2CH_2OCH_2CH_2OCH_2CH_3$, $OCH_2CH_2OCH_2CH_2OCH_2CH_2OCH_2CH_3$, $CH_2CH_2OCH_2CH_2OCH_2CH_2OCH_2CH_2OCH_2CH_3$, $OCH_2CH_2OCH_2CH_2OCH_2CH_2OCH_2CH_2OCH_2CH_3$, $CH_2CH_2OCH_2CH_2OCH_2CH_2OCH_2CH_3$, $CH_2CH_2OCH_2CH_2OCH_2CH_2OCH_2CH_3$, $CH_2CH_2OCH_2CH_2OCH_2CH_2OCH_2CH_3$, $CH_2CH_2O(CH_2)_8CH_3$, $CH_2CH_2CH_2O(CH_2)_9CH_3$, $CH_2CH_2CH_2O(CH_2)_{10}CH_3$, $CH_2CH_2CH_2O(CH_2)_{11}CH_3$, $CH_2CH_2CH_2O$ (CH$_2$)$_{12}$CH$_3$, CH$_2$CH$_2$CH$_2$O(CH$_2$)$_{13}$CH$_3$, CH$_2$CH$_2$CH$_2$O (CH$_2$)$_{14}$CH$_3$, CH$_2$CH$_2$CH$_2$O(CH$_2$)$_{15}$CH$_3$, and CH$_2$CH$_2$CH$_2$O(CH$_2$)$_{16}$CH$_3$ groups.

Preferable examples of R$^1$ to R$^8$ include hydrogen atom, fluorine atom, and alkyl group having 1 to 10 carbon atoms with an optional substituent Z$^2$. More preferable examples include hydrogen atom, fluorine atom, and alkyl group having 1 to 4 carbon atoms with an optional substituent Z$^2$. It is most desirable that all of R$^1$ to R$^8$ are hydrogen atoms.

Preferable examples of R$^{11}$ include alkyl group having 1 to 15 carbon atoms and alkyl group having 2 to 10 carbon atoms and having the ether structure, both having an optional substituent Z$^2$. More preferable examples include alkyl group having 1 to 10 carbon atoms with an optional substituent Z$^2$ and those groups represented by Formula (A):

[Chemical Formula 12]

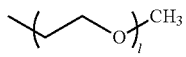
(A)

wherein letter l represents an integer of 1 to 5.

The substituent Z$^2$ should preferably be a halogen atom, more preferably a fluorine atom. Most desirably, the substituent Z$^2$ should be absent (or there should be no substitution).

The above-mentioned triarylamine compound, arylaldehyde compound, fluorene derivative, and carbazole derivative can be obtained by polycondensation in the presence of an acid catalyst.

The condensation should be carried in such a way that one equivalent of aryl group in the triarylamine compound reacts with aldehyde compound, fluorene derivative, and carbazole derivative in a total amount of about 0.01 to 10 equivalents, preferably 0.05 to 5 equivalents, more preferably 0.1 to 3 equivalents.

For adequate condensation, the aldehyde compound and fluorene derivative should be used in such amounts that the former accounts for 1 equivalent and the latter accounts for 0.1 to 20 equivalents, more preferably 1 to 15 equivalents, and most desirably 5 to 10 equivalents. In addition, the aldehyde compound and carbazole derivative should be used in such amounts that the former accounts for 1 equivalent and the latter accounts for 0.1 to 20 equivalents, preferably 1 to 15 equivalents, and most desirably 5 to 10 equivalents.

The acid catalyst may be selected from mineral acids such as sulfuric acid, phosphoric acid, and perchloric acid; organic sulfonic acids such as p-toluenesulfonic acid and p-toluenesulfonic acid hydride; and carboxylic acids such as formic acid and oxalic acid.

The acid catalyst should be used in varied amounts depending on its kind. The ordinary amount for 1 equivalent of the triarylamine compound is 0.001 to 10 equivalents, preferably 0.01 to 5 equivalents, more preferably 0.1 to 1 equivalent.

Although the above-mentioned condensation may be carried out in the absence of solvent, but usually in the presence of solvent. Any solvent may be used so long it is not harmful to the reaction. Some typical examples are listed below. Cyclic ethers such as tetrahydrofuran and 1,4-dioxane; amides such as N,N-dimethylformamide (DMF), N,N-dimethylacetamide (DMAc), and N-methyl-2-pyrrolidone (NMP); ketones such as methyl isobutyl ketone and cyclohexanone; halogenated hydrocarbons such as methylene chloride, chloroform, 1,2-dichloroethane, and chlorobenzene; and aromatic hydrocarbons such as benzene, toluene, and xylene. These solvents may be used alone or in combination with one another. Most desirable among them are cyclic ethers.

Any acid catalyst in liquid form like formic acid may also serve as a solvent.

The reaction temperature for condensation is usually 40 to 200° C., and the reaction time for condensation usually ranges from 30 minutes to 50 hours, depending on the reaction temperature.

The polymer obtained as mentioned above varies in weight-average molecular weight (Mw), which ranges usually from 500 to 200,000, preferably 1,000 to 100,000.

The charge-transporting varnish according to the present invention should be made from the charge-transporting substance which is the above-mentioned polymer containing a fluorine atom and an oligoaniline compound as the charge-transporting substance containing no fluorine atom.

The oligoaniline compound to be used in the present invention should preferably be that represented by Formula (9) although it may be adequately selected from any known ones without specific restriction.

[Chemical Formula 13]

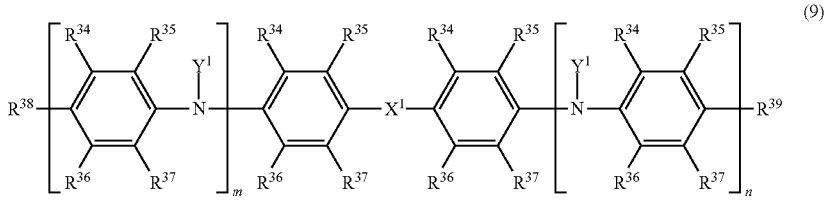
(9)

Symbols in Formula (9) are defined as follows. R$^{34}$ to R$^{39}$ mutually independently represent a hydrogen atom, halogen atom other than fluorine atom, nitro group, or cyano group, or an alkyl group having 1 to 20 carbon atoms, alkenyl group having 2 to 20 carbon atoms, or alkynyl group having 2 to 20 carbon atoms, each having an optional substituent Z$^6$, an aryl group having 6 to 20 carbon atoms or heteroaryl group having 2 to 20 carbon atoms, each having an optional substituent Z$^7$, —NHY$^2$, —NY$^3$Y$^4$, —C(O)Y$^5$, —OY$^6$, —SY$^7$, —SO$_3$Y$^8$, —C(O)OY$^9$, —OC(O)Y$^{10}$, —C(O)NHY$^{11}$, or —C(O)NY$^{12}$Y$^{13}$ group, with Y$^2$ to Y$^{13}$ mutually independently representing an alkyl group having 1 to 20 carbon atoms, alkenyl group having 2 to 20 carbon atoms, or alkynyl group having 2 to 20 carbon atoms, each having an optional substituent Z$^6$, an aryl group having 6 to 20 carbon atoms or heteroaryl group having 2 to 20 carbon atoms, each having an optional substituent Z$^7$.

$X^1$ represents —$NY^1$—, —O—, —S—, —$(CR^{40}R^{41})_k$—, or a single bond, with $R^{40}$ and $R^{41}$ being identical with $R^{34}$; and letter k represents an integer of 1 to 20.

$Y^1$ independently represents a hydrogen atom, alkyl group having 1 to 20 carbon atoms, alkenyl group having 2 to 20 carbon atoms, or alkynyl group having 2 to 20 carbon atoms, each having an optional substituent $Z^6$, an aryl group having 6 to 20 carbon atoms or heteroaryl group having 2 to 20 carbon atoms, each having an optional substituent $Z^7$.

$Z^6$ represents a halogen atom other than fluorine atom, nitro group, cyano group, or an aryl group having 6 to 20 carbon atoms or heteroaryl group having 2 to 20 carbon atoms, each having an optional substituent $Z^8$.

$Z^7$ represents a halogen atom other than fluorine atom, nitro group, cyano group, or an alkyl group having 1 to 20 carbon atoms, alkenyl group having 2 to 20 carbon atoms, or alkynyl group having 2 to 20 carbon atoms, each having an optional substituent $Z^8$.

$Z^8$ represents a halogen atom other than fluorine atom, nitro group, or cyano group, and letters m and n are mutually independently an integer of 1 to 10, with m+n≤10.

Typical examples of the heteroaryl groups each having 2 to 20 carbon atoms include 2-thienyl, 3-thienyl, 2-furanyl, 3-furanyl, 2-oxazoryl, 4-oxazoryl, 5-oxazoryl, 3-isooxazoryl, 4-isooxazoryl, 5-isooxazoryl, 2-thiazoryl, 4-thiazoryl, 5-thiazoryl, 3-isothiazoryl, 4-isothiazoryl, 5-isothiazoryl, 2-imidazoryl, 4-imidazoryl, 2-pyridyl, 3-pyridyl, and 4-pyridyl groups.

The halogen atom, alkyl group, alkenyl group, alkynyl group, and aryl group are defined as above.

In Formula (9), $X^1$ should preferably be —$NY^1$— or a single bond.

Preferable examples of $R^{34}$ to $R^{37}$ include hydrogen atom, chlorine atom, bromine atom, nitro group, alkyl group having 1 to 20 carbon atoms with an optional substituent $Z^6$, and aryl group having 6 to 10 carbon atoms with an optional substituent $Z^7$. More preferable examples include hydrogen atom and alkyl group having 1 to 10 carbon atoms with an optional substituent $Z^6$. Most desirably, all of them should be hydrogen atoms.

Preferable examples of $R^{38}$ and $R^{39}$ include hydrogen atom, chlorine atom, bromine atom, nitro group, alkyl group having 1 to 20 carbon atoms with an optional substituent $Z^6$, aryl group having 6 to 10 carbon atoms with an optional substituent $Z^7$, and —$NY^3Y^4$ group, wherein $Y^3$ and $Y^4$ are an aryl group having 6 to 20 carbon atoms with an optional substituent $Z^7$. That is, the —$NY^3Y^4$ group is an amino group having two aryl groups each having 6 to 20 carbon atoms and each having an optional substituent $Z^7$. More preferable example include hydrogen atom and diarylamino group having 12 to 24 carbon atoms. Most desirably, they should be a hydrogen atom or diphenylamino group.

Preferable examples of $R^{40}$ and $R^{41}$ include hydrogen atom, alkyl group having 1 to 20 carbon atoms with an optional substituent $Z^6$, and aryl group having 6 to 10 carbon atoms with an optional substituent $Z^7$. More preferable example include hydrogen atom and alkyl group having 1 to 10 carbon atoms with an optional substituent $Z^6$. Most desirably, both of them should be hydrogen atoms.

Preferable examples of $Y^1$ include hydrogen atom and alkyl group having 1 to 20 carbon atoms with an optional substituent $Z^6$, more preferable examples include hydrogen atom and methyl group, and most desirably $Y^1$ should be a hydrogen atom. Incidentally, $Y^1$'s may be different from or identical with each other.

Particularly, it is desirable that $R^{34}$ to $R^{37}$ represent a hydrogen atom or alkyl group having 1 to 10 carbon atoms, $R^{38}$ and $R^{39}$ represent a hydrogen atom or diarylamino group having 12 to 24 carbon atoms, $X^1$ represents —$NY^1$— or a single bond, and $Y^1$ represents a hydrogen atom or methyl group. It is more desirable that all of $R^{34}$ to $R^{37}$ represent hydrogen atoms, both of $R^{38}$ and $R^{39}$ represent hydrogen atoms or diphenylamino groups, $X^1$ represents —$NY^1$— or a single bond, and $Y^1$ represents a hydrogen atom.

Incidentally, the substituent $Z^6$ in $Y^1$ to $Y^{13}$ and $R^{34}$ to $R^{41}$ should preferably be a chlorine atom, bromine atom, nitro group, cyano group, or aryl group having 6 to 20 carbon atoms with an optional substituent $Z^8$. More preferably, it should be a chlorine atom, bromine atom, or phenyl group having an optional substituent $Z^8$. Most desirably, the substituent $Z^6$ should be absent (or there should be no substitution).

Also, the substituent $Z^7$ should preferably be a chlorine atom, bromine atom, nitro group, cyano group, or alkyl group having 1 to 20 carbon atoms with an optional substituent $Z^8$. More preferably, it should be a chlorine atom, bromine atom, or alkyl group having 1 to 4 carbon atoms with an optional substituent $Z^8$. Most desirably, the substituent $Z^7$ should be absent (or there should be no substitution).

In addition, the substituent $Z^8$ should preferably be a chlorine atom or bromine atom. More preferably, the substituent $Z^8$ should be absent (or there should be no substitution)

The above oligoaniline compound containing no fluorine atom should have a molecular weight which is usually 300 to 5,000 but, for high solubility, preferably up to 4,000, more preferably up to 3,000, and most desirably up to 2,000.

Incidentally, the oligoaniline compound used in the present invention may be synthesized in any way without specific restrictions. Some synthesis methods are found in Bulletin of Chemical Society of Japan (1994, Vol. 67, pp. 1749-1752), Synthetic Metals (1997, Vol. 84, pp. 119-120), and PCT Patent Publication Nos. 2008/032617, 2008/032616, 2008/129947, and 2013/084664.

The charge-transporting varnish according to the present invention is not specifically restricted in the usage ratio between the charge-transporting substance containing a fluorine atom and the charge-transporting substance containing no fluorine atom. However, for the resulting organic EL element to have high luminance characteristics and good durability, the amount (by mass) of the charge-transporting substance containing a fluorine atom for 1 part of the charge-transporting substance containing no fluorine atom should be about 0.1 to 5 parts, preferably about 0.5 to 3 parts, more preferably about 0.5 to 1 part.

In addition, the charge-transporting varnish according to the present invention contains a dopant substance which is a heteropolyacid.

The heteropolyacid is defined as a polyacid which typically has the chemical structure of Keggin type represented by Formula (B) or Dawson type represented by Formula (C), with the heteroatom being positioned at the center of the molecule. It is formed by condensation from an isopolyacid and an oxygen acid with a foreign element. The isopolyacid is an oxygen acid of vanadium (V), molybdenum (Mo), or tungsten (W). The oxygen acid with foreign element is silicon (Si), phosphor (P), or arsenic (As).

[Chemical Formula 14]

(B)

(C)

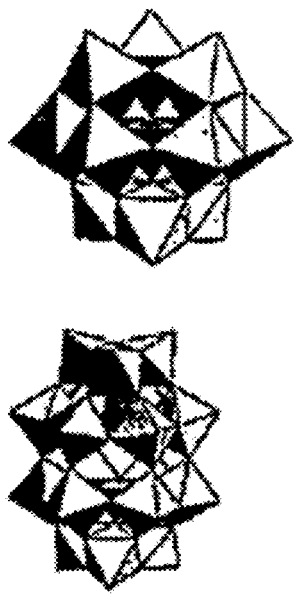

The heteropolyacid includes, for example, phosphomolybdic acid, silicomolybdic acid, phosphotungstic acid, silicotungstic acid, and phosphotungstomolybdic acid. They may be used alone or in combination with one another. Moreover, they are commercially available or can be synthesized by any known methods.

Preferable among the above examples, from the standpoint of allowing the organic EL element to have improved luminance characteristics, are phosphomolybdic acid and phosphotungstic acid, with the latter being more preferable.

For the meantime, the heteropolyacid to be used in the present invention is not specifically restricted so long as it is a commercial product or it is an adequately synthesized product based on any known methods even though its composition, that is, the number of constituent atoms, is different from that of the general formula found by quantitative analysis such as elemental analysis.

That is to say, although the phosphotungstic acid and silicomolybdic acid are represented respectively by the chemical formulas of $H_3(PW_{12}O_{40}) \cdot nH_2O$ and $H_3(PMo_{12}O_{40}) \cdot nH_2O$ the number of constituent atoms, i.e., the number of atoms of P (phosphorus), O (oxygen), W (tungsten), and Mo (molybdenum) may be different from that found by quantitative analysis. Despite such variation in the number of atoms, they can be used so long as they are obtained from a commercial source or by adequate synthesis based on any known methods. In such a case, the mass of the heteropolyacid specified in the present invention should not be construed as the mass (content) of pure phosphotungstic acid in the synthesized product or commercial product but as the total amount of the substance containing hydrated water and other impurities which substance can be isolated from commercial products or synthesized products.

According to the present invention, the amount of the heteropolyacid, preferably phosphotungstic acid, to be used for 1 part by weight of the oligoaniline compound should be about 2 to 10 parts, preferably about 2.5 to 9.0 parts. This amount is desirable for the heteropolyacid to give the charge transporting-thin film that permits the organic EL element to exhibit high luminance.

For the desirable charge-transporting varnish, the heteropolyacid and oligoaniline compound should be used in such amounts that the ratio of the mass ($W_D$) of the former to the mass ($W_H$) of the latter is $2 \leq W_D/W_H \leq 10$, preferably $2.5 \leq W_D/W_H \leq 9.0$.

The charge-transporting varnish according to the present invention may contain a curing agent so that it gives rise to a thin film with good solvent resistance.

The curing agent includes, without specific restrictions, any known ones such as (meth)acrylate compounds, epoxy compounds, and those compounds having blocked isocyanate groups. Preferable among these examples are acrylate-based curing agents, such as (meth)acrylate compound or any composition containing it. More preferable one is polyfunctional acrylate-based curing agents, such as a polyfunctional (meth)acrylate compound and any composition containing it.

Typical examples of the acrylate-based curing agent are listed below.

Hexanediol di(meth)acrylate, neopentylglycol di(meth)acrylate, triethyleneglycol di(meth)acrylate, polyethyleneglycol di(meth)acrylate, polypropyleneglycol di(meth)acrylate, pentaerythritol di(meth)acrylate monostearate, bisphenol A ethylene glycol adduct (meth)acrylate, bisphenol F ethylene glycol adduct (meth)acrylate, tricyclo[5.2.1.0$^{2,6}$]decanemethanol di(meth)acrylate, trishydroxyethylisocyanurate di(meth)acrylate, trimethylolpropane tri(meth)acrylate, trimethylolpropane ethylene glycol adduct tri(meth)acrylate, trimethylolpropane propylene glycol adduct tri(meth)acrylate, pentaerythritol tri(meth)acrylate, tris(meth)acryloyloxyethyl phosphate, trishydroxyethylisocyanurate tri(meth)acrylate, modified s-caprolactone tri(meth)acrylate, trimethylolpropane ethoxy tri(meth)acrylate, glycerin propylene glycol adduct tris(meth)acrylate, pentaerythritol tetra(meth)acrylate, pentaerythritol ethylene glycol adduct tetra(meth)acrylate, ditrimethylolpropane tetra(meth)acrylate, dipentaerythritol hexapenta(meth)acrylate, dipentaerythritol monohydroxy penta(meth)acrylate, urethane (meth)acrylate, epoxy (meth)acrylate, polyester (meth)acrylate, unsaturated polyester, 9,9-bis[4-(2-acryloyloxyethoxy)phenyl]fluorene, "OGSOL EA-0200, OGSOL EA-F5003, OGSOL EA-F5503, and OGSOL EA-F5510" (all from Osaka Gas Chemicals Co., Ltd.), and "NK Ester A-BPEF and NK Ester A-BPEF/PGMAC 70" (both from Shin-Nakamura Chemical Co., Ltd.).

The curing agent is not specifically restricted in amount. An adequate amount may be arbitrarily selected so long as the curing agent imparts desirable solvent resistance to the thin film to be formed and produces no adverse effects on the intrinsic properties, such as charge-transportability, of the thin film. The curing agent should be used in an amount of about 0.01 to 10 parts by weight, preferably about 0.05 to 5.0 parts, more preferably about 0.10 to 2.0 parts, for 1 part by weight of the total amount of the charge-transporting substance containing a fluorine atom, the charge-transporting substance containing no fluorine atom, and the dopant substance of heteropolyacid.

The charge-transporting varnish may be prepared with the help of a solvent capable of rapidly dissolving the charge-transporting substance and dopant substance. The solvent includes, for example, such organic solvents as N,N-dimethylformamide, N,N-dimethylacetamide, N-methylpyrrolidone, 1,3-dimethyl-2-imidazolidinone, and diethyleneglycol monomethyl ether. They may be used alone or in combination with one another. The amount of such a solvent should be 5 to 100 wt % of the total amount of the solvents used for the varnish.

Incidentally, the above solvent should preferably completely dissolves or uniformly disperses therein the charge-transporting substance and dopant substance. Complete dissolution is preferable.

The charge-transporting vanish according to the present invention may be incorporated with at least one kind of high-viscosity organic solvents which have a viscosity of 10 to 200 mPa·s, preferably 35 to 150 mPa·s at 25° C., and a boiling point of 50 to 300° C., preferably 150 to 250° C. under normal pressure or atmospheric pressure. Such additional solvents help adjust the varnish viscosity and help produce consistently a highly flat thin film. Thus, they facilitate the preparation of the vanish that suits to the specific coating method employed.

Examples of the high-viscosity organic solvent unrestrictedly include cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol, and hexylene glycol. They may be used alone or in combination with one another.

The amount of the high-viscosity organic solvent to be added to the varnish according to the present invention should be such that no solids separate out from the vanish. It usually ranges from 5 to 80 wt % of the total amount of the solvents so long as there is no solid separation.

The varnish may be further incorporated with another additional solvent for the purpose of improving the substrate wettability and adjusting the surface tension, polarity, and boiling point of the solvent. The amount of the additional solvent should usually be 1 to 90 wt %, preferably 1 to 50 wt %, of the total amount of the solvents added to the varnish.

Examples of the additional solvent unrestrictedly include ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, diethylene glycol monoethyl ether, diacetone alcohol, γ-butyrolactone, ethyl lactate, and n-hexyl acetate. They may be used alone or in combination with one another.

The varnish according to the present invention may have an adequate viscosity which varies depending on the thickness of the thin film to be formed and the concentration of solids in the varnish. The adequate viscosity is usually 1 to 50 mPa·s at 25° C.

Also, the charge-transporting varnish according to the present invention should contain solids in an adequate amount which varies depending on the viscosity and surface tension of the varnish and the thickness of the thin film to be formed. The adequate amount is usually about 0.1 to 10.0 wt %, preferably 0.5 to 5.0 wt %, and more preferably 1.0 to 3.0 wt % for improved varnish coatability.

The charge-transporting varnish mentioned above is finally applied to a substrate, followed by calcination, so that it forms a charge-transporting thin film on the substrate.

The method for varnish application is not specifically restricted; it includes, for example, dip coating, spin coating, slit coating, transfer printing, roll coating, brushing, inkjet coating, and spray coating. The varnish should preferably be varied in viscosity and surface tension according to the coating method employed.

The varnish according to the present invention should be calcined after coating in an atmosphere of air, inert gas, such as nitrogen, or vacuum, which is not specifically restricted. The calcination helps form the charge-transporting thin film which has a uniform surface and high charge-transportability.

Calcination should be carried out at an adequate temperature, ranging from 100 to 260° C. depending on the usage of the resulting thin film and the charge transportability required of the resulting thin film. In the case where the thin film is formed between and in contact with the anode and emitting layer of the organic EL element so that the thin film functions as a functional single layer or hole injecting-transporting layer, the calcining temperature should preferably be about 140 to 250° C., more preferably about 150 to 230° C. In the case where the thin film needs to be formed highly uniformly or the thin film needs to undergo reaction on the substrate, calcination may be carried out in two or more stages at different temperatures. Heating for calcination may be accomplished by means of a hot plate or oven.

The charge-transporting thin film is not specifically restricted in thickness. The one to be used in the organic EL element may have a thickness ranging from about 5 to 200 nm. However, in the case where the two kinds of the charge-transporting substances according to the present invention need phase separation to a certain high degree, so that the organic EL element improves in luminance characteristics and a life property, the thickness should be 10 to 100 nm, preferably 20 to 50 nm, and more desirably 25 to 45 nm.

The thickness may be varied by adjusting the concentration of solids in the varnish or by adjusting the amount of the solution to be applied onto the substrate.

The charge-transporting varnish according to the present invention is used to produce OLED elements by various processes in conjunction with various materials. Typical examples of processes and materials are shown below without specific restrictions.

The electrode substrates for the organic EL element should preferably be cleaned in advance with a liquid, such as detergent, alcohol, and pure water. Especially, the anode substrate should preferably undergo, just before use, surface treatment, such as UV ozone treatment and oxygen-plasma treatment. However, this surface treatment is not necessary in the case where the anode substrate is composed mainly of organic materials.

The following is an illustrative description of the process for producing the OLED element having a functional single film or hole injecting-transporting layer, which is a thin film obtained from the charge-transporting varnish according to the present invention.

The process starts with coating the anode substrate with the charge-transporting varnish according to the present invention, followed by calcination as mentioned above, thereby forming a functional single film on the electrode. The resulting coated substrate is placed in a vacuum deposition apparatus, and the functional single film is further coated by vacuum deposition sequentially with an emitting layer, electron transporting layer, electron injecting layer, and cathode metal layer. Thus there is obtained the OLED element as desired. Incidentally, an electron blocking layer may optionally be formed between the emitting layer and the hole injecting-transporting layer.

The anode may be formed from a transparent material, such as indium-tin oxide (ITO) and indium-zinc oxide (IZO), or from a metal, such as aluminum and alloy thereof. The anode should preferably be planarized. It may also be formed from a polythiophene derivative or polyaniline derivative which is highly capable of charge transportation.

Examples of other metals than aluminum to be used for the metal anode unrestrictedly include the following. Scandium, titanium, vanadium, chromium, manganese, iron, cobalt, nickel, copper, zinc, gallium, yttrium, zirconium, niobium, molybdenum, ruthenium, rhodium, palladium, cadmium, indium, scandium, lanthanum, cerium, praseodymium, neodymium, promethium, samarium, europium, gadolinium, terbium, dysprosium, holmium, erbium, thulium, ytterbium, hafnium, thallium, tungsten, rhenium, osmium, iridium, platinum, gold, titanium, lead, and bismuth, and alloys thereof.

The emitting layer may be formed from any one of the following materials. Tris(8-quinolinolato)aluminum(III) (Alq$_3$), bis(8-quinolinolato)zinc(II) (Znq$_2$), bis(2-methyl-8-quinolinolato)-4-(p-phenylphenolate)-aluminum(III) (BAlq), 4,4'-bis(2,2-diphehylvinyl)biphenyl, 9,10-di(naphthalen-2-yl)anthracene, 2-t-butyl-9,10-di(naphthalen-2-yl) anthracene, 2,7-bis[9,9-di(4-methylphenyl)-fluoren-2-yl]-9,9-di(4-methyl-phenyl)fluorene, 2-methyl-9,10-bis (naphthalen-2-yl)anthracene, 2-(9,9-spirobifluoren-2-yl)-9,9-spirobifluorene, 2,7-bis(9,9-spirobifluoren-2-yl)-9,9-spirobifluorene, 2-[9,9-di(4-methylphenyl)-fluoren-2-yl]-9,9-di(4-methyl-phenyl)fluorene, 2,2'-dipyrenyl-9,9-spirobifluorene, 1,3,5-tris(pyren-1-yl)benzene, 9,9-bis[4-(pyrenyl)phenyl]-9H-fluorene, 2,2'-bi(9,10-diphenylanthracene), 2,7-dipyrenyl-9,9-spirobifluorene, 1,4-di(pyren-1-yl)benzene, 1,3-di(pyren-1-yl)benzene, 6,13-di(biphenyl-4-yl)pentacene, 3,9-di(naphthalen-2-yl) perylene, 3,10-di(naphthalen-2-yl)perylene, tris[4-(pyrenyl)-phenyl]amine, 10,10'-di(biphenyl-4-yl)-9,9'-bianthracene, N,N'-di(naphthalen-1-yl)-N,N'-diphenyl-[1,1':4',1":4'",1'"-quaterphenyl]-4,4'"-diamine, 4,4'-di[10-(naphthalen-1-yl)anthracen-9-yl]biphenyl, dibenzo{[f,f']-4,4',7,7'-tetraphenyl}diindeno[1,2,3-cd:1',2',3'-lm]perylene, 1-(7-(9,9'-bianthracen-10-yl)-9,9-dimethyl-9H-fluoren-2-yl)pyrene, 1-(7-(9,9'-bianthracen-10-yl)-9,9-dihexyl-9H-fluoren-2-yl) pyrene, 1,3-bis(carbazol-9-yl)benzene, 1,3,5-tris(carbazol-9-yl)benzene, 4,4',4"-tris(carbazol-9-yl)triphenylamine, 4,4'-bis(carbazol-9-yl)biphenyl, 4,4'-bis(carbazol-9-yl)-2,2'-dimethylbiphenyl, 2,7-bis(carbazol-9-yl)-9,9-dimethylfluorene, 2,2',7,7'-tetrakis(carbazol-9-yl)-9,9-spirobifluorene, 2,7-bis(carbazol-9-yl)-9,9-di(p-tolyl)fluorene, 9,9-bis[4-(carbazol-9-yl)-phenyl]fluorene, 2,7-bis(carbazol-9-yl)-9,9-spirobifluorene, 1,4-bis(triphenylsilyl)benzene, 1,3-bis(triphenylsilyl)benzene, bis-6-N,N-diethylamino-2-methylphenyl)-4-methylphenylmethane, 2,7-bis(carbazol-9-yl)-9,9-dioctylfluorene, 4,4"-di(triphenylsilyl)-p-terphenyl, 4,4'-di(triphenylsilyl)biphenyl, 9-(4-t-butylphenyl)-3,6-bis (triphenylsilyl)-9H-carbazole, 9-(4-t-butylphenyl)-3,6-ditrityl-9H-carbazole, 9-(4-t-butylphenyl)-3,6-bis(9-(4-methoxyphenyl)-9H-fluoren-9-yl)-9H-carbazole, 2,6-bis(3-(9H-carbazol-9-yl)phenyl)pyridine, triphenyl(4-(9-phenyl-9H-fluoren-9-yl)phenyl)silane, 9,9-dimethyl-N,N-diphenyl-7-(4-(1-phenyl-1H-benzo[d]imidazol-2-yl)phenyl)-9H-fluorene-2-amine, 3,5-bis(3-(9H-carbazol-9-yl)phenyl) pyridine, 9,9-spirobifluoren-2-yl-diphenyl-phosphine oxide, 9,9'-(5-(triphenylsilyl)-1,3-phenylene)bis(9H-carbazole), 3-(2,7-bis(diphenylphosphoryl)-9-phenyl-9H-fluoren-9-yl)-9-phenyl-9H-carbazole, 4,4,8,8,12,12-hexa(p-tolyl)-4H-8H-12H-12C-azadibenzo[cd,mn]-pyrene, 4,7-di(9H-carbazol-9-yl)-1,10-phenanthroline, 2,2'-bis(4-carbazol-9-yl)phenyl) biphenyl, 2,8-bis(diphenylphosphoryl)dibenzo[b,d] thiophene, bis(2-methylphenyl)diphenylsilane, bis[3,5-di (9H-carbazol-9-yl)phenyl]diphenylsilane, 3,6-bis(carbazol-9-yl)-9-(2-ethyl-hexyl)-9H-carbazole, 3-(diphenylphosphoryl)-9-(4-(diphenylphosphoryl)phenyl)-9H-carbazole, and 3,6-bis[(3,5-diphenyl)phenyl]-9-phenylcarbazole.

The emitting layer may also be formed by codeposition together with the light emitting dopant.

Examples of the light emitting dopant are listed below. 3-(2-benzothiazolyl)-7-(diethylamino)coumarin, 2,3,6,7-tetrahydro-1,1,7,7-tetramethyl-1H,5H,11H-10-(2-benzo-thiazolyl)quinolizino[9,9a,1gh]coumarin, quinacridone, N,N'-dimethyl-quinacridone, tris(2-phenylpyridine)iridium(III) (Ir (ppy)$_3$), bis(2-phenylpyridine)(acetylacetonate)iridium(III) (Ir(ppy)$_2$(acac)), tris[2-(p-tolyl)pyridine]iridium(III) (Ir(m-ppy)$_3$), 9,10-bis[N,N-di(p-tolyl)amino]anthracene, 9,10-bis [phenyl(m-tolyl)amino]anthracene, bis[2-(2-hydroxyphenyl)benzothiazolato]zinc(II), $N^{10},N^{10},N^{10'},N^{10'}$-tetra(p-tolyl)-9,9'-bianthracene-10,10'-diamine, $N^{10},N^{10},N^{10'},N^{10'}$-tetraphenyl-9,9'-bianthracene-10,10'-diamine, $N^{10},N^{10'}$-diphenyl-$N^{10},N^{10'}$-dinaphthalenyl-9,9'-bianthracene-10,10'-diamine, 4,4'-bis(9-ethyl-3-carbazovinylene)-1,1'-biphenyl, perylene, 2,5,8,11-tetra-t-butylperylene, 1,4-bis[2-(3-N-ethylcarbazolyl)vinyl]benzene, 4,4'-bis[4-(di-p-tolylamino) styryl]biphenyl, 4-(di-p-tolylamino)-4'-[(di-p-tolylamino) styryl]stilbene, bis[3,5-difluoro-2-(2-pyridyl)phenyl-(2-carboxypyridyl)]-iridium(III), 4,4'-bis[4-(diphenylamino) styryl]biphenyl, bis(2,4-difluorophenylpyridinato)tetrakis (1-pyrazolyl)borate-iridium(III), N,N'-bis(naphthalen-2-yl)-N,N'-bis(phenyl)-tris(9,9-dimethyl-fluorenilene), 2,7-bis(2-[phenyl(m-tolyl)amino]-9,9-dimethyl-fluoren-7-yl)-9,9-dimethyl-fluorene, N-(4-((E)-2-(6((E)-4-(diphenylamino) styryl)naphthalen-2-yl)vinyl)phenyl)-N-phenylbenzeneamine, fac-iridium(III) tris(1-phenyl-3-methylbenzimidazolin-2-ylidene-C,C$^{2'}$), mer-iridium(III) tris(1-phenyl-3-methylbenzimidazolin-2-indene-C,C$^{2'}$), 2,7-bis[4-(diphenylamino)styryl]-9,9-spirobifluorene, 6-methyl-2-(4-(9-(4-(6-methylbenzo[d]thiazol-2-yl)phenyl)-anthracen-10-yl)phenyl)benzo[d]thiazole, 1,4-di[4-(N,N-diphenyl)amino]styrylbenzene, 1,4-bis(4-(9H-carbazol-9-yl)styryl)benzene, (E)-6-(4-(diphenylamino)styryl)-N,N-diphenylnaphthalene-2-amine, bis(2,4-difluorophenylpyridinato)(5-(pyridin-2-yl)-1H-tetrazolate) iridium(III), bis(3-trifluoromethyl-5-(2-pyridyl)pyrazole) ((2,4-difluoro-benzyl)diphenylphosphinate)iridium(III), bis (3-trifluoromethyl-5-(2-pyridyl)pyrazolate)(benzyl-diphenylphosphinate)iridium(III), bis(1-(2,4-difluorobenzyl)-3-methylbenzimidazolium)(3-(trifluoromethyl)-5-(2-pyridyl)-1,2,4-triazolate)iridium(III), bis(3-trifluoromethyl-5-(2-pyridyl)pyrazolate)(4',6'-difluoro-phenylpyridinate)iridium(III), bis(4',6'-difluorophenylpyridinato)(3,5-bis(trifluoromethyl)-2-(2'-pyridyl)pyrolate)iridium(III), bis(4',6'-difluorophenylpyridinato)(3-(trifluoromethyl)-5-(2-pyridyl)-1,2,4-triazolate)iridium(III), (Z)-6-mesityl-N-(6-mesitylquinoline-2(1H)-ylidene)quinoline-2-amine-BF$_2$, (E)-2-(2-(4-(dimethylamino)styryl)-6-methyl-4H-pyrane-4-ylidene)malononitrile, 4-(dicyanomethylene)-2-methyl-6-julolidyl-9-enyl-4H-pyrane, 4-(dicyanomethylene)-2-methyl-6-(1,1,7,7-tetramethyl-julolidyl-9-enyl)-4H-pyrane, 4-(dicyanomethylene)-2-t-butyl-6-(1,1,7,7-tetramethyl-julolidin-4-yl-vinyl)-4H-pyrane, tris(dibenzoylmethane)phenanthrolineeuropium(III), 5,6,11,12-tetraphenylnaphthacene, bis(2-benzo[b]thiophen-2-yl-pyridine)(acetylacetonate)-iridium(III), tris(1-phenylisoquinoline)iridium(III), bis(1-phenylisoquinoline) (acetylacetonate)iridium(III), bis[1-(9,9-dimethyl-9H-fluoren-2-yl)-isoquinoline](acetyl-acetonate)iridium(III), bis[2-(9,9-dimethyl-9H-fluoren-2-yl)quinoline](acetyl-acetonate)iridium(III), tris[4,4'-di-t-butyl-(2,2')-bipyridine]ruthenium(III), bis(hexafluorophosphate), tris(2-phenylquinoline)iridium(III), bis(2-phenylquinoline)(acetylacetonate) iridium(III), 2,8-di-t-butyl-5,11-bis(4-t-butylphenyl)-6,12-diphenyl-tetracene, bis(2-phenylbenzothiazolato)

(acetylacetonate)iridium(III), 5,10,15,20-tetraphenyltetrabenzoporphyrinplatinum, osmium(II) bis(3-trifluoromethyl-5-(2-pyridine)-pyrazolate)-dimethylphenylphosphine, osmium(II) bis(3-trifluoromethyl)-5-(4-t-butylpyridyl)-1,2,4-triazolate) diphenylmethylphosphine, osmium(II) bis(3-(trifluoromethyl)-5-(2-pyridyl)-1,2,4-triazole) dimethylphenylphosphine, osmium(II) bis(3-(trifluoromethyl)-5-(4-t-butylpyridyl)-1,2,4-triazolate) dimethylphenylphosphine, bis[2-(4-n-hexylphenyl)quinoline](acetylacetonate)iridium(III), tris[2-(4-n-hexylphenyl)quinoline]iridium(III), tris[2-phenyl-4-methylquinoline]iridium(III), bis(2-phenylquinoline)(2-(3-methylphenyl)pyridinate)-iridium(III), bis(2-(9,9-diethyl-fluoren-2-yl)-1-phenyl-1H-benzo[d]-imidazolato)(acetylacetonate)iridium(III), bis(2-phenylpyridine)(3-(pyridin-2-yl)-2H-chromen-2-onate)-iridium(III), bis(2-phenylquinoline)(2,2,6,6-tetramethylheptane-3,5-dionate)iridium(III), bis(phenylisoquinoline)(2,2,6,6-tetramethylheptane-3,5-dionate)iridium(III), iridium(III) bis(4-phenylthieno[3,2-c]pyridinato-N,$C^{2'}$)acetyl-acetonate, (E)-2-(2-t-butyl-6-(2-(2,6,6-trimethyl-2,4,5,6-tetrahydro-1H-pyrolo[3,2,1-ij]quinolin-8-yl)vinyl)-4H-pyran-4-ylidene)malononitrile, bis(3-trifluoromethyl-5-(1-isoquinolyl)pyrazolate)(methyl-diphenylphosphine)ruthenium, bis[(4-n-hexylphenyl)isoquinoline](acetylacetonate)-iridium (III), platinum(II) octaethylporphine, bis(2-methyldibenzo[f,h]quinoxaline)(acetylacetonate)-iridium(III), and tris[(4-n-hexylphenyl)xoquinoline]iridium(III).

The electron transporting layer and hole blocking layer may be formed from any one of the following materials. 8-hydroxyquinolinolate-lithium, 2,2',2''-(1,3,5-benzenetolyl)-tris(1-phenyl-1-H-benzimidazole), 2-(4-biphenyl)5-(4-t-butylphenyl)-1,3,4-oxadiazole, 2,9-dimethyl-4,7-diphenyl-1,10-phenanthroline, 4,7-diphenyl-1,10-phenanthroline, bis(2-methyl-8-quinolinolate)-4-(phenylphenolato)aluminum, 1,3-bis[2-(2,2'-bipyridin-6-yl)-1,3,4-oxadiazo-5-yl]benzene, 6,6'-bis[5-(biphenyl-4-yl)-1,3,4-oxadiazo-2-yl]-2,2'-bipyridine, 3-(4-biphenyl)-4-phenyl-5-t-butylphenyl-1,2,4-triazole, 4-(naphthalen-1-yl)-3,5-diphenyl-4H-1,2,4-(triazole), 2,9-bis(naphthalen-2-yl)-4,7-diphenyl-1,10-phenanthroline, 2,7-bis[2-(2,2'-bipyridin-6-yl)-1,3,4-oxadiazo-5-yl]-9,9-dimethylfluorene, 1,3-bis[2-(4-t-butylphenyl)-1,3,4-oxadiazo-5-yl]benzene, tris(2,4,6-trimethyl-3-(pyridin-3-yl)phenyl)borane, 1-methyl-2-(4-(naphthalen-2-yl)phenyl)-1H-imidazo-[4,5f][1,10] phenanthroline, 2-(naphthalen-2-yl)-4,7-diphenyl-1,10-phenanthroline, phenyl-dipyrenylphosphineoxide, 3,3',5,5'-tetra[(m-pyridyl)-phen-3-yl]biphenyl, 1,3,5-tris[(3-pyridyl)-phen-3-yl]benzene, 4,4'-bis(4,6-diphenyl-1,3,5-triazin-2-yl)biphenyl, 1,3-bis[3,5-di(pyridin-3-yl)phenyl]benzene, bis (10-hydroxybenzo[h]quinolinato)beryllium, diphenylbis(4-(pyridin-3-yl)phenyl)silane, and 3,5-di(pyren-1-yl)pyridine.

The electron injecting layer may be formed from any one of the following materials. Lithium oxide ($Li_2O$), magnesium oxide (MgO), alumina ($Al_2O_3$), lithium fluoride (LiF), sodium fluoride (NaF), magnesium fluoride ($MgF_2$), cesium fluoride (CsF), strontium fluoride ($SrF_2$), molybdenum trioxide ($MoO_3$), aluminum, Li(acac), lithium acetate, and lithium benzoate.

The cathode may be formed from any one of the following materials. Aluminum, magnesium-silver alloy, aluminum-lithium alloy, lithium, sodium, potassium, and cesium.

The electron blocking layer may be formed from tris (phenylpyrazole)iridium.

The charge-transporting varnish according to the present invention is used to form PLED elements by any one of the following methods.

The PLED element differs from the OLED element in having a functional single film or a hole injecting-transporting layer, which is a light-emitting polymer layer formed from the charge-transporting varnish of the present invention, in place of an emitting layer, electron transporting layer, and electron injecting layer to be formed one over another by vacuum deposition.

To be specific, the PLED element is obtained by sequentially forming the functional single film as mentioned above, the light-emitting polymer layer, and the cathode on the anode substrate by vacuum deposition by applying the charge-transporting varnish of the present invention on the anode substance.

The cathode and anode may be formed from the same materials as used in production of the above OLED. They are finished by cleaning and surface treatment in the same way as in production of the OLED.

The light-emitting polymer layer may be formed by coating the functional single film with the light-emitting polymeric material, optionally in combination with the dopant substance, in the form of solvent solution or uniform dispersion, followed by calcination.

Examples of the light-emitting polymeric material include polyfluorene derivative, e.g., poly(9,9-dialkyl-fluorene) (PDAF), polyphenylenevinylene derivative, e.g., poly(2-methoxy-5-(2'-ethylhexoxy)-1,4-phenylenevinylene) (MEH-PPV), polythiophene derivative, e.g., poly(3-alkylthiophene) (PAT), and polyvinylcarbazole (PVCz).

The solvent includes, for example, toluene, xylene, and chloroform. Dissolution and uniform dispersion may be accomplished by stirring, stirring with heating, or ultrasonic dispersion.

Coating methods unrestrictedly include inkjet coating, spray coating, dip coating, spin coating, transfer printing, roll coating, and brushing. Coating in an inert gas, such as nitrogen and argon, is desirable.

Calcination may be accomplished by heating with an oven or hot plate in an inert gas or vacuum.

EXAMPLES

The present invention will be described in more detail by reference to the following Synthesis Examples, Examples, and Comparative Examples. The Examples are not intended to restrict the scope of the present invention. Apparatuses used in these examples are listed below.
(1) For substrate cleaning: Substrate cleaning apparatus (low-pressure plasma type), made by Choshu Industry Co., Ltd.
(2) For varnish coating: Spin-coater MS-A100, made by Mikasa Co., Ltd.
(3) For film thickness measurement: Microfigure measuring instrument SURFCODER ET-4000 to measure fine shapes, made by Kosaka Laboratory Ltd.
(4) For measurement of polymer molecular weight: Column: SHODEX GPC KF-803L GPC, KF-804L; Column temperature: 40° C.; Detector: UV detector (254 nm) and RI detector; Eluent: THF; Column flow velocity: 1.0 mL/minute); made by Shimadzu Corporation.
(5) For production of EL element: Multi-functional deposition apparatus' system C-E2L1G1-N, made by Choshu Industry Co., Ltd.

[1] Synthesis of Monomer

Synthesis Example 1

[Chemical Formula 15]

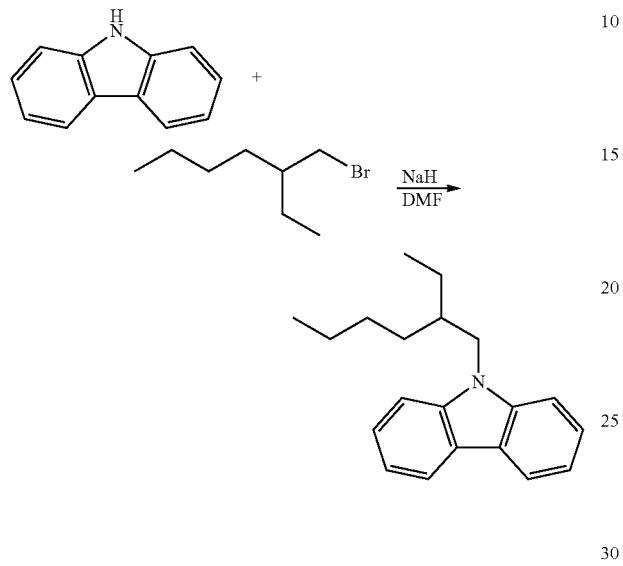

A solution containing N,N-dimethylformamide (84 mL) in carbazole (8.36 g, 50 mmol) and 2-ethylhexyl bromide (8620 μL, 50 mmol) was prepared. After cooling to 0° C., the solution was given sodium hydride (60% in liquid paraffin) (2.62 g, 60 mmol). The resulting solution was heated to room temperature and stirred for 18 hours. The reaction solution was quenched by addition of water and then extracted with ethyl acetate. The organic layer was dried with sodium sulfate and then freed of solvent by concentration under reduced pressure. The thus obtained crude product was purified by silica gel column chromatography (eluted with hexane), followed by solvent removal by concentration under reduced pressure. Thus, there was obtained N-(2-ethylhexyl)carbazole (9.60 g).

$^1$H-NMR (300 MHz, CDCl$_3$):

δ0.84-0.93 (m, 6H), 1.23-1.41 (m, 8H), 2.05-2.09 (m, 1H), 4.13-4.21 (m, 2H), 7.17-7.25 (m, 2H), 7.38-7.48 (m, 4H), 8.10 (dd, J=0.9, 7.8 Hz, 2H).

[Synthesis Example 2] Synthesis of Polymer 1

[Chemical Formula 16]

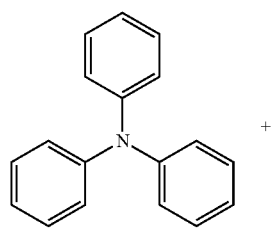

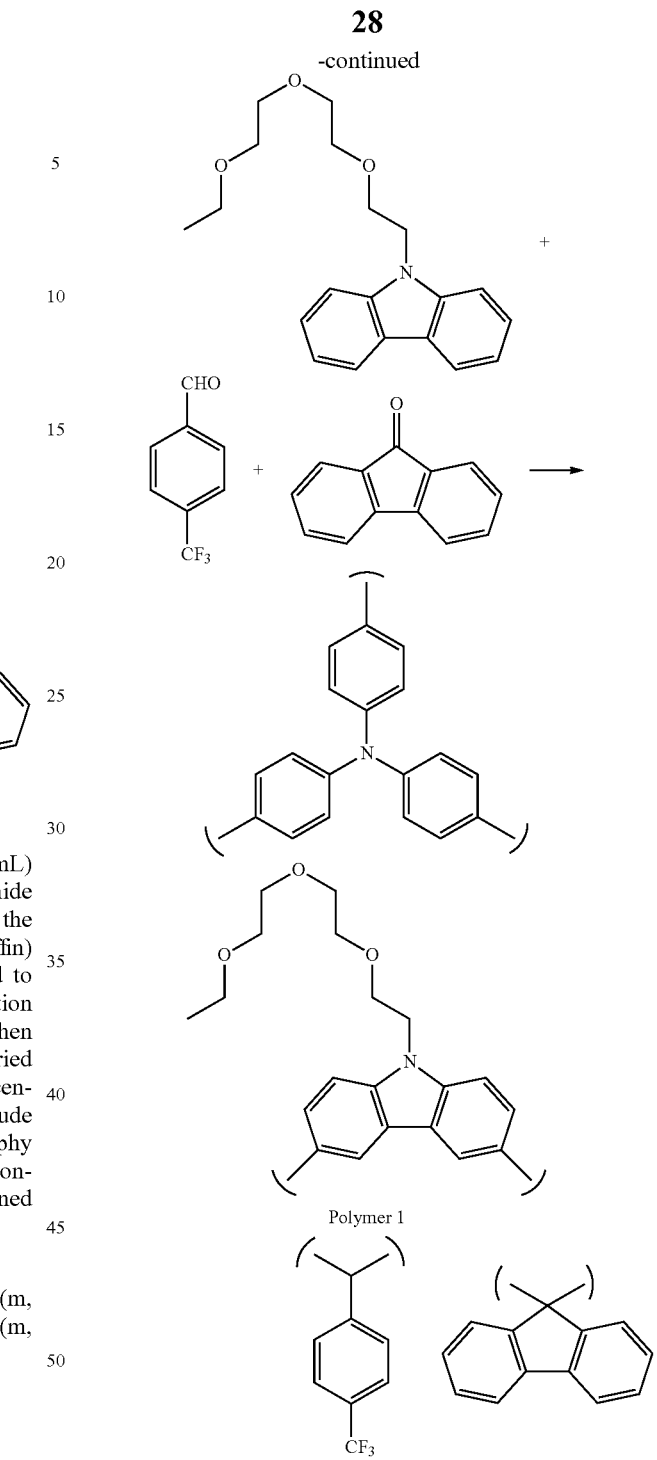

The process was started by adding 1,4-dioxane (30 g) to triphenylamine (11.04 g, 45 mmol), N-TEG carbazole derivative synthesized by the method described in Synthetic Metals, 89(3), 171 (1997) (4.70 g, 15 mmol), 4-trifluoromethylbenzaldehyde (0.823 g, 6.3 mmol), 9-fluorenone (7.66 g, 56.7 mmol), and p-toluenesulfonic acid (11.95 g, 60 mmol). The resulting mixture was heated to 110° C. and stirred for three hours at this temperature. After cooling to room temperature, the reaction product was diluted with tetrahydrofuran (10 mL). The resulting diluted solution was added dropwise to a mixture of methanol (800 mL) and 28% ammonia water (100 mL), followed by stirring for 30 minutes. The resulting solution was filtered by suction to recover precipitated powder. The recovered powder was dissolved in tetrahydrofuran (80 mL). The resulting solution was added dropwise to methanol (800 mL), followed by stirring for 30 minutes. The resulting solution was filtered by suction to recover precipitated powder. After drying under reduced pressure, there was obtained polymer 1 (8.8 g) as desired.

Mw (GPC)=3,200

IR (cm$^{-1}$): 1588, 1504, 1488, 1446, 1323, 1271, 1165, 1122, 1067, 1017, 818, 749, 736, 693, 646, 633, 618.

[Synthesis Example 3] Synthesis of Polymer 2

[Chemical Formula 17]

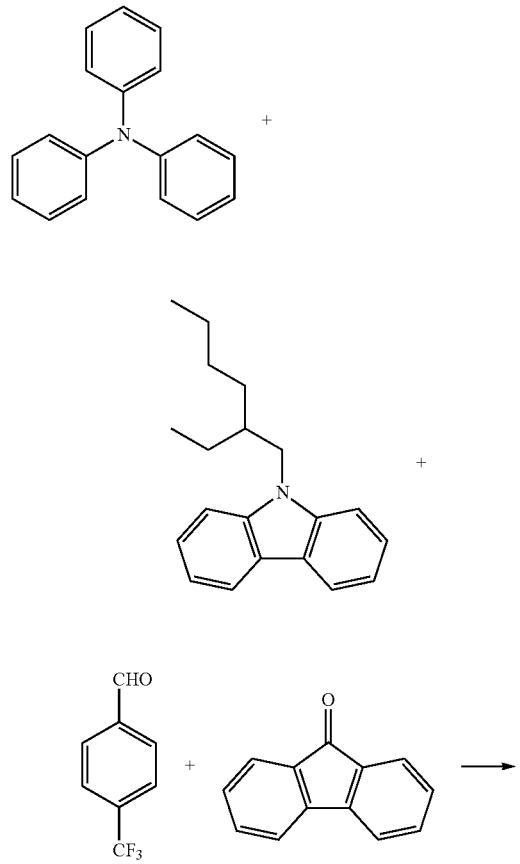

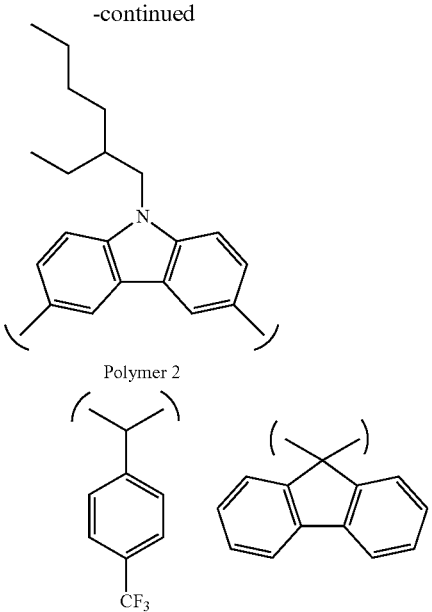

Polymer 2

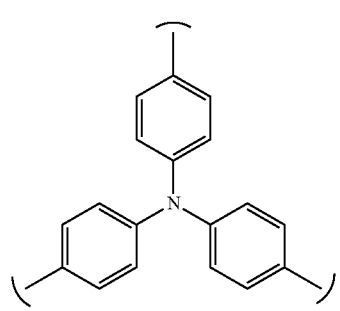

The process was started by adding 1,4-dioxane (5 g) to triphenylamine (1.84 g, 7.5 mmol), N-ethylhexylcarbazole (0.70 g, 2.5 mmol) obtained in Synthesis Example 1, 4-trifluoromethylbenzaldehyde (134 μL, 1 mmol), 9-fluorenone (1.62 g, 9 mmol), and p-toluenesulfonic acid (1.90 g, 10 mmol). The resulting mixture was heated to 110° C. and stirred for four hours at this temperature. After cooling to room temperature, the reaction product was diluted with tetrahydrofuran (5 mL). The resulting diluted solution was added dropwise to a mixture of methanol (125 mL) and 28% ammonia water (25 mL), followed by stirring for 30 minutes. The resulting solution was filtered by suction to recover precipitated powder. The recovered powder was dissolved in tetrahydrofuran (40 mL). The resulting solution was added dropwise to methanol (125 mL), followed by stirring for 30 minutes. The resulting solution was filtered by suction to recover precipitated powder. After drying under reduced pressure, there was obtained polymer 2 (2.0 g) as desired.

Mw (GPC)=2,600

IR (cm$^{-1}$): 1589, 1503, 1488, 1446, 1322, 1270, 1165, 1122, 1067, 1016, 818, 748, 735, 694, 632, 618.

[2] Preparation of Charge-Transporting Varnish

[Example 1] Charge-Transporting Varnish A

First, a mixture was prepared from polymer 1 (63 mg) obtained in Synthesis Example 2, oligoaniline compound 1 (13 mg) synthesized according to the method disclosed in PCT Patent Publication No. 2013/084664, and phosphotungstic acid (65 mg) (from Kanto Chemical Co., Inc.). To this mixture was added 1,3-dimethylimidazolidinone (1.5 g) in a glove box of nitrogen circulating type, followed by stirring with heating at 50° C. for dissolution. To the resulting solution was added cyclohexanol (1.5 g) with stirring to give a green solution. Finally, this solution was filtered through a syringe filter having a hole diameter of 0.2 μm. Thus, there was obtained charge-transporting varnish A.

[Chemical Formula 18]

Oligoaniline compound 1

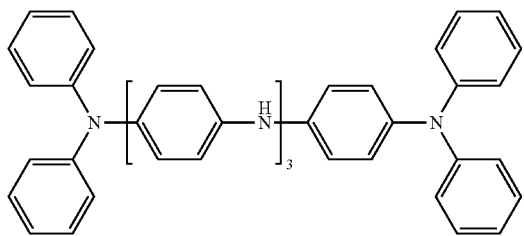

[Example 2] Charge-Transporting Varnish B

The same procedure as in Example 1 was repeated to give charge-transporting varnish except that the amount of polymer 1 was changed to 78 mg.

[Example 3] Charge-Transporting Varnish C

The same procedure as in Example 1 was repeated to give charge-transporting varnish except that polymer 1 was replaced by polymer 2 (63 mg) obtained in Synthesis Example 3.

[Comparative Example 1] Charge-Transporting Varnish D

The same procedure as in Example 1 was repeated to give charge-transporting varnish except that polymer 1 was not used and the amount of oligoaniline compound 1 and phosphotungstic acid was changed to 13 mg and 65 mg, respectively.

[Example 4] Charge-Transporting Varnish E

First, a mixture was prepared from polymer 1 (44 mg) obtained in Synthesis Example 2, oligoaniline compound 1 (10 mg) synthesized according to the method disclosed in PCT Patent Publication No. 2013/084664, phosphotungstic acid (49 mg) (from Kanto Chemical Co., Inc.), and OGSOL EA-F5003 (89 mg) (from Osaka Gas Chemicals Co., Ltd.). To this mixture was added 1,3-dimethylimidazolidinone (1.5 g) in a glove box of nitrogen circulating type, followed by stirring with heating at 50° C. for dissolution. To the resulting solution was added cyclohexanol (1.5 g) with stirring to give a green solution. Finally, this solution was filtered through a syringe filter having a hole diameter of 0.2 μm. Thus, there was obtained charge-transporting varnish E.

[Example 5] Charge-Transporting Varnish F

The same procedure as in Example 4 was repeated to give charge-transporting varnish except that OGSOL EA-F5003 (89 mg) was replaced by NK Ester A-BPEF (59 mg) (from Shin-Nakamura Chemical Co., Ltd.).

[4] Production of Organic EL Element (OLED Element) and Evaluation of its Properties A specimen for evaluation of electrical properties was prepared on a glass substrate (measuring 25 mm×25 mm×0.7 mm thick) with a patterned coating film of indium-tin oxide (150 nm thick). (This substrate will be abbreviated as ITO substrate hereinafter.) The ITO substrate was used after removing impurities from the surface thereof by means of an $O_2$ plasma cleaner (150 W, for 30 seconds).

[Example 6] Preparation of an OLED Element from Charge-Transporting Varnish A

The ITO substrate was coated by a spin coater with charge-transporting varnish A obtained in Example 1, followed by drying at 50° C. for five minutes and calcination at 230° C. for 15 minutes. Thus, a uniform thin film (30 nm) was formed on the ITO substrate.

The ITO substrate having a thin film formed thereon underwent vacuum deposition by means of a deposition apparatus (at $1.0 \times 10^{-5}$ Pa) sequentially with tris(8-quinolinolato)-aluminum(III) ($Alq_3$), lithium fluoride, and aluminum. Thus, there was obtained an OLED element having thin films formed thereon one over another. The rate of vacuum deposition of $Alq_3$ was 0.2 nm/second, the rate of vacuum deposition of aluminum was 0.2 nm/second, and the rate of vacuum deposition of lithium fluoride was 0.02 nm/second, and their film thickness was 40 nm, 0.5 nm, and 100 nm, respectively.

Incidentally, the evaluation of properties was performed after the OLED element had been sealed between sealing substrates to protect the specimen from deterioration of their properties by oxygen and moisture in air. Sealing was accomplished in the following manner.

The organic EL element was held between sealing substrates in an atmosphere of nitrogen (containing up to 2 ppm of oxygen and having a dew point of −85° C.). Then, the sealing substrates were bonded together with an adhesive (XNR5516Z-B1, from Nagase ChemteX Corporation). The OLED element was sealed between the sealing substrates together with a water collecting agent (HD-071010W-40, from Dynic Corporation).

The bonded sealing substrates were irradiated with UV light (365 nm in wave length and 6000 mJ/cm² in dosage), followed by annealing at 80° C. for one hour, so that the adhesive was cured.

[Example 7] Preparation of an OLED Element from Charge-Transporting Varnish B

The same procedure as in Example 6 was repeated to prepare the specimen of OLED element except that charge-transporting varnish A was replaced by charge-transporting varnish B obtained in Example 2.

[Example 8] Preparation of an OLED Element from Charge-Transporting Varnish C

The same procedure as in Example 6 was repeated to prepare the specimen of OLED element except that charge-transporting varnish A was replaced by charge-transporting varnish C obtained in Example 3.

[Comparative Example 2] Preparation of an OLED Element from Charge-Transporting Varnish D The same procedure as in Example 6 was repeated to prepare the specimen of OLED element except that charge-transporting varnish A was replaced by charge-transporting varnish D obtained in Comparative Example 1.

[Example 9] Preparation of an OLED Element from Charge-Transporting Varnish E

The same procedure as in Example 6 was repeated to prepare the specimen of OLED element except that charge-transporting varnish A was replaced by charge-transporting varnish E obtained in Example 4.

[Example 10] Preparation of an OLED Element from Charge-Transporting Varnish F

The same procedure as in Example 6 was repeated to prepare the specimen of OLED element except that charge-transporting varnish A was replaced by charge-transporting varnish F obtained in Example 5.

The specimens of OLED element which were obtained in Examples 6 to 10 and Comparative Example 2 were tested twice for electrical properties by using a current-voltage-luminance measuring system. Each test was conducted with the current density, luminance, and current efficiency (at a drive voltage 7V) as shown in Table 1.

TABLE 1

|  | First Measurement | | | Second Measurement | | |
| --- | --- | --- | --- | --- | --- | --- |
|  | Current density ($mA/cm^2$) | Luminance ($cd/m^2$) | Current efficiency (cd/A) | Current density ($mA/cm^2$) | Luminance ($cd/m^2$) | Current efficiency (cd/A) |
| Example 6 | 385 | 5060 | 1.3 | 376 | 4760 | 1.3 |
| Example 7 | 298 | 3705 | 1.3 | 293 | 3505 | 1.2 |
| Example 8 | 257 | 2745 | 1.1 | 237 | 2570 | 1.1 |
| Comparative Example 2 | 2320 | 1345 | 0.1 | 2075 | 239 | 0.0 |
| Example 9 | 210 | 2180 | 1.0 | 215 | 2140 | 1.0 |
| Example 10 | 242 | 2425 | 1.0 | 244 | 2360 | 1.0 |

It is shown in Table 1 that the specimen in Comparative Example 2, which was prepared from charge-transporting varnish D not containing polymer 1 or polymer 2, is extremely low in current efficiency and also low in luminance relative to current density.

It is also shown that the specimens in Examples 6 to 10, which were incorporated with polymer 1 or polymer 2, gave almost the same values in the first and second measurements, whereas the specimen in Comparative Example 2 decreased almost by half in luminance in the second measurement. This fact suggests that the OLED element in Comparative Example 2 has a shorter life and those in Examples 6 to 10 have a longer life.

The foregoing apparently demonstrates that the OLED element improves in current efficiency as well as life if the charge-transporting varnish is incorporated with polymer 1 or polymer 2.

[5] Evaluation of Toluene Resistance of Thin Film

[Example 11] Thin Film Prepared from Charge-Transporting Varnish A

Charge-transporting varnish A obtained in Example 1 was applied to the ITO substrate by a spin coater, followed by drying at 80° C. for one minute and calcination at 250° C. for 15 minutes, so that a uniform thin film (30 nm thick) was formed on the ITO substrate. The coated substrate was allowed to hold thereon 0.5 mL of toluene. One minute later, the substrate was freed of toluene by spinning. After drying at 120° C. for one minute, the film thickness was measured with a feeler-type film thickness meter. The thus measured thickness was compared with the thickness measured before stripping with toluene, so that the remaining film rate was calculated.

[Example 12] Thin Film Prepared from Charge-Transporting Varnish E

The same procedure as in Example 11 was repeated to calculate the remaining film rate except that charge-transporting varnish A was replaced by charge-transporting varnish E obtained in Example 4.

[Example 13] Thin Film Prepared from Charge-Transporting Varnish F

The same procedure as in Example 11 was repeated to calculate the remaining film rate except that charge-transporting varnish A was replaced by charge-transporting varnish F obtained in Example 5.

TABLE 2

|  | Remaining film rate (Ratio of film thickness after toluene stripping to film thickness before toluene stripping) |
| --- | --- |
| Example 11 | 50% |
| Example 12 | 98% |
| Example 13 | 99% |

It is shown in Table 2 that the thin film obtained from the varnish incorporated with a crosslinking agent improves in toluene resistance. This suggests that the charge-transporting thin film according to the present invention permits another functional thin film to be formed thereon by coating with a varnish based on an aromatic organic solvent typified by toluene.

The invention claimed is:
1. A charge-transporting varnish comprising:
   a charge-transporting substance containing a fluorine atom;
   a charge-transporting substance containing no fluorine atom;
   a dopant substance of heteropolyacid; and
   an organic solvent,
   wherein said charge-transporting substance containing the fluorine atom is a polymer having a weight-average molecular weight of 1,000 to 200,000 which is obtained by condensation from a triarylamine compound, arylaldehyde compound containing a fluorine atom, fluorene derivative having a carbonyl group, and carbazole derivative having at the N-position an alkyl group or an alkyl group having an ether structure,
   said charge-transporting substance containing no fluorine atom is an oligoaniline compound.

2. The charge-transporting varnish of claim 1,
wherein the charge-transporting substance containing the fluorine atom is a polymer which is obtained by condensation from a triarylamine compound represented by Formula (1), an arylaldehyde compound containing a fluorine atom represented by Formula (2), a fluorene derivative having a carbonyl group represented by Formula (3) or (4), and a carbazole derivative represented by Formula (5):

[Chemical Formula 1]

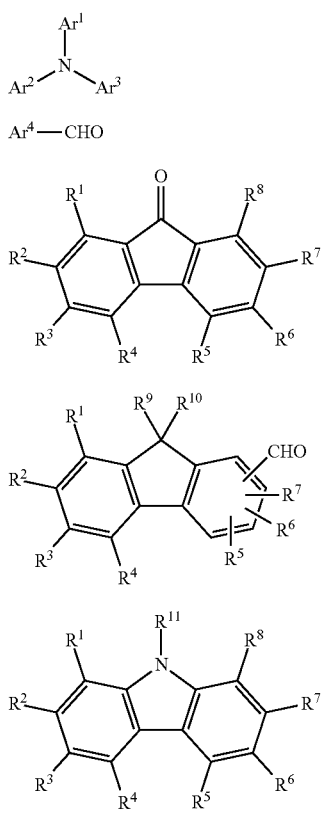

(1)

(2)

(3)

(4)

(5)

wherein $Ar^1$ to $Ar^3$ mutually independently represent an aryl group having 6 to 20 carbon atoms with an optional substituent $Z^1$, with each aryl group being composed of carbon atoms at least one of which has no substituent;
$Ar^4$ represents an aryl group having 6 to 20 carbon atoms with at least one substituent $Z^3$ and an optional substituent $Z^4$;
$R^1$ to $R^8$ mutually independently represent a hydrogen atom, halogen atom, nitro group, cyano group or an alkyl group having 1 to 20 carbon atoms, alkenyl group having 2 to 20 carbon atoms, or alkynyl group having 2 to 20 carbon atoms, each having an optional substituent $Z^2$;
$R^9$ and $R^{10}$ mutually independently represent a hydrogen atom or an alkyl group having 1 to 20 carbon atoms, (poly)ethyleneoxide group having 2 to 20 carbon atoms, alkenyl group having 2 to 20 carbon atoms, or alkynyl group having 2 to 20 carbon atoms, each having an optional substituent $Z^2$ or alkyl group having 1 to 20 carbon atoms, a substituent of ethenyl group or ethynyl group and an optional substituent $Z^2$;
$R^{11}$ represents an alkyl group having 1 to 20 carbon atoms or alkyl group having 2 to 20 carbon atoms and having the ether structure, both having an optional substituent $Z^2$;

$Z^1$ represents a halogen atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^2$;
$Z^2$ represents a halogen atom, nitro group, or cyano group;
$Z^3$ represents a fluorine atom, fluorinated alkyl group having 1 to 20 carbon atoms, or fluorinated aryl group having 6 to 20 carbon atoms;
$Z^4$ represents a chlorine atom, bromine atom, iodine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^5$; and
$Z^5$ represents a chlorine atom, bromine atom, iodine atom, nitro group, or cyano group.

3. The charge-transporting varnish of claim 2,
wherein said triarylamine compound is a triphenylamine derivative represented by Formula (6):

[Chemical Formula 2]

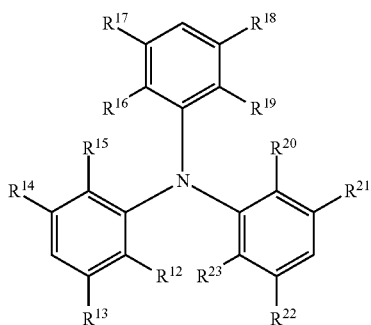

(6)

wherein $R^{12}$ to $R^{23}$ mutually independently represent a hydrogen atom, halogen atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^2$.

4. The charge-transporting varnish of claim 2 or 3,
wherein said arylaldehyde compound is a benzaldehyde derivative represented by Formula (7) or (8):

[Chemical Formula 3]

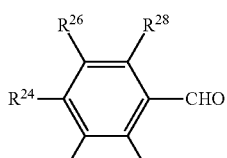

(7)

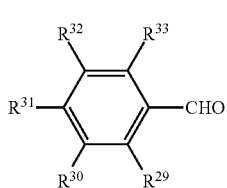

(8)

wherein $R^{24}$ represents a fluorine atom or fluorinated alkyl group having 1 to 20 carbon atoms;

$R^{25}$ to $R^{28}$ mutually independently represent a hydrogen atom, nitro group, cyano group, or an alkyl group having 1 to 20 carbon atoms optionally substituted with a nitro group or cyano group; and $R^{29}$ to $R^{33}$ mutually independently represent a fluorine atom or fluorinated alkyl group having 1 to 20 carbon atoms.

5. The charge-transporting varnish of claim 1,
wherein said oligoaniline compound is one represented by Formula (9):

[Chemical Formula 4]

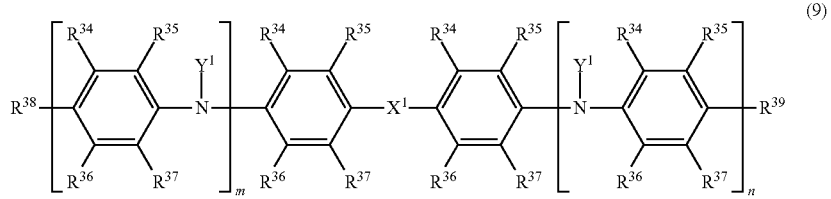

(9)

wherein $R^{34}$ to $R^{39}$ mutually independently represent a hydrogen atom, halogen atom other than fluorine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^6$, or an aryl group having 6 to 20 carbon atoms or heteroaryl group having 2 to 20 carbon atoms, each having an optional substituent $Z^7$, or —NHY$^2$, —NY$^3$Y$^4$, —C(O)Y$^5$, —OY$^6$, —SY$^7$, —SO$_3$Y$^8$, —C(O)OY$^9$, —OC(O)Y$^{10}$, —C(O)NHY$^{11}$, or —C(O)NY$^{12}$Y$^{13}$ group;

$Y^2$ to $Y^{13}$ mutually independently represent an alkyl group having 1 to 20 carbon atoms, alkenyl group having 2 to 20 carbon atoms, or alkynyl group having 2 to 20 carbon atoms, each having an optional substituent $Z^6$, or an aryl group having 6 to 20 carbon atoms or heteroaryl group having 2 to 20 carbon atoms, each having an optional substituent $Z^7$;

$X^1$ represents —NY$^1$—, —O—, —S—, —(CR$^{40}$R$^{41}$)$_k$—, or a single bond wherein $R^{40}$ and $R^{41}$ are identical with the $R^{34}$ mentioned above;

letter k represents an integer of 1 to 20;

$Y^1$ represents independently a hydrogen atom, or an alkyl group having 1 to 20 carbon atoms, alkenyl group having 2 to 20 carbon atoms, or alkynyl group having 2 to 20 carbon atoms, each having an optional substituent $Z^6$, or an aryl group having 6 to 20 carbon atoms or heteroaryl group having 2 to 20 carbon atoms, each having an optional substituent $Z^7$;

$Z^6$ represents a halogen atom other than fluorine atom, nitro group, or cyano group, or an aryl group having 6 to 20 carbon atoms or heteroaryl group having 2 to 20 carbon atoms, each having an optional substituent $Z^8$;

$Z^7$ represents a halogen atom other than fluorine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^8$;

$Z^8$ represents a halogen atom other than fluorine atom, nitro group, or cyano group; and letters m and n mutually independently represent an integer of 1 to 10, with m+n≤10.

6. The charge-transporting varnish of claim 1,
wherein said heteropolyacid is phosphotungstic acid.

7. The charge-transporting varnish of claim 1, further comprising a curing agent.

8. The charge-transporting varnish of claim 7,
wherein said curing agent is a curing agent of acrylate type.

9. A charge-transporting thin film prepared from the charge-transporting varnish of claim 1.

10. An electronic device having the charge-transporting thin film of claim 9.

11. An organic electroluminescence element having the charge-transporting thin film of claim 9.

12. An organic electroluminescence element including at least an anode, a cathode, an emitting layer, and a charge-transporting thin film of claim 9,
wherein said charge-transporting thin film is arranged between and in contact with said anode and said emitting layer.

13. A method for preparing a charge-transporting thin film comprising:
coating a substrate with the charge-transporting varnish of claim 1; and
evaporating a solvent.

14. A method for preparing an organic electroluminescence element which has the charge-transporting thin film of claim 9.

15. A polymer having a weight-average molecular weight of 1,000 to 200,000 which is obtained by condensation from a triarylamine compound represented by Formula (1), a fluorine atom-containing arylaldehyde compound represented by Formula (2), a fluorene derivative having a carbonyl group represented by Formula (3) or (4), and a carbazole derivative represented by Formula (5):

[Chemical Formula 5]

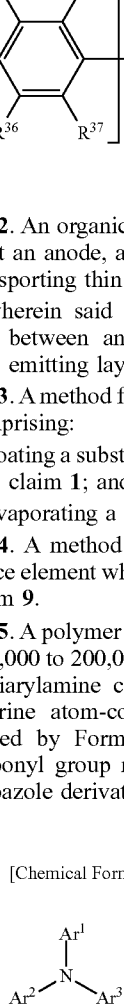

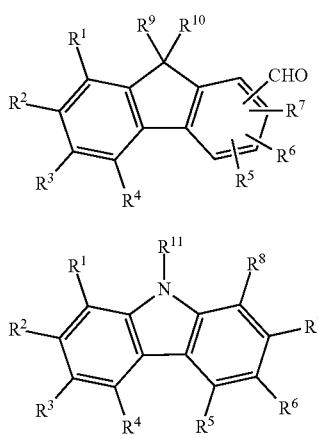

(4)

(5)

wherein $Ar^1$ to $Ar^3$ mutually independently represent an aryl group having 6 to 20 carbon atoms with an optional substituent $Z^1$, each aryl group being composed of carbon atoms at least one of which has no substituent;

$Ar^4$ represents an aryl group having 6 to 20 carbon atoms with at least one substituent $Z^3$ and an optional substituent $Z^4$;

$R^1$ to $R^8$ mutually independently represent a hydrogen atom, halogen atom, nitro group or cyano group or an alkyl group having 1 to 20 carbon atoms, alkenyl group having 2 to 20 carbon atoms, or alkynyl group having 2 to 20 carbon atoms, each having an optional substituent $Z^2$;

$R^9$ and $R^{10}$ mutually independently represent a hydrogen atom and an alkyl group having 1 to 20 carbon atoms, (poly)ethyleneoxide group having 2 to 20 carbon atoms, alkenyl group having 2 to 20 carbon atoms, or alkynyl group having 2 to 20 carbon atoms, each having an optional substituent $Z^2$ or alkyl group having 1 to 20 carbon atoms, a substituent of ethenyl group or ethynyl group and an optional substituent $Z^2$;

$R^{11}$ represents an alkyl group having 1 to 20 carbon atoms or alkyl group having 2 to 20 carbon atoms and an ether structure, both having an optional substituent $Z^2$;

$Z^1$ represents a halogen atom, nitro group, cyano group, or an alkyl group having 1 to 20 carbon atoms, alkenyl group having 2 to 20 carbon atoms, or alkynyl group having 2 to 20 carbon atoms, each having an optional substituent $Z^2$;

$Z^2$ represents a halogen atom, nitro group, or cyano group;

$Z^3$ represents a fluorine atom, fluorinated alkyl group having 1 to 20 carbon atoms, or fluorinated aryl group having 6 to 20 carbon atoms;

$Z^4$ represents a chlorine atom, bromine atom, iodine atom, nitro group, or cyano group, or an alkyl group having 1 to 20 carbon atoms, alkenyl group having 2 to 20 carbon atoms, or alkynyl group having 2 to 20 carbon atoms, each having an optional substituent $Z^5$; and $Z^5$ represents a chlorine atom, bromine atom, iodine atom, nitro group, or cyano group.

* * * * *